(12) United States Patent
Sparrowe et al.

(10) Patent No.: US 12,376,485 B2
(45) Date of Patent: Jul. 29, 2025

(54) SELF-ASSEMBLED MONOLAYER FOR ELECTRODE MODIFICATION AND DEVICE COMPRISING SUCH SELF-ASSEMBLED MONOLAYER

(71) Applicant: MERCK PATENT GMBH, Darmstadt (DE)

(72) Inventors: David Sparrowe, Bournemouth (GB); Changsheng Wang, Durham (GB); William Mitchell, Chandler's Ford (GB)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 18/649,840

(22) Filed: Apr. 29, 2024

(65) Prior Publication Data
US 2024/0298522 A1    Sep. 5, 2024

Related U.S. Application Data

(62) Division of application No. 17/299,698, filed as application No. PCT/EP2019/081261 on Nov. 14, 2019, now abandoned.

(30) Foreign Application Priority Data

Dec. 4, 2018    (EP) ..................................... 18210015

(51) Int. Cl.
*H10K 71/12*    (2023.01)
*H10K 85/40*    (2023.01)
*H10K 10/82*    (2023.01)
*H10K 30/82*    (2023.01)
*H10K 50/805*   (2023.01)
*H10K 102/10*   (2023.01)

(52) U.S. Cl.
CPC ............. *H10K 85/40* (2023.02); *H10K 10/82* (2023.02); *H10K 30/82* (2023.02); *H10K 50/805* (2023.02); *H10K 71/12* (2023.02); *H10K 2102/103* (2023.02)

(58) Field of Classification Search
CPC .. H10K 85/40; H10K 71/12; H10K 2102/103; H10K 30/82; H10K 10/82
See application file for complete search history.

(56) References Cited

U.S. PATENT DOCUMENTS

| | | | | |
|---|---|---|---|---|
| 11,795,186 B2 * | 10/2023 | Luschtinetz | .......... | C07F 9/5765 |
| 2014/0147628 A1 * | 5/2014 | Kiyomori | ............ | C09D 183/08 |
| | | | | 428/141 |

\* cited by examiner

*Primary Examiner* — Mohsen Ahmadi
*Assistant Examiner* — Christopher A Culbert
(74) *Attorney, Agent, or Firm* — David K. Benson; Versum Materials US, LLC

(57) ABSTRACT

The present application relates to a self-assembled monolayer suitable for the modification of electrodes comprised in electronic devices as well as to such electronic devices. The present application also relates to a method for depositing such self-assembled monolayer onto an electrode as well as to the manufacturing of the corresponding devices.

13 Claims, 1 Drawing Sheet

SELF-ASSEMBLED MONOLAYER FOR ELECTRODE MODIFICATION AND DEVICE COMPRISING SUCH SELF-ASSEMBLED MONOLAYER

CROSS-REFERENCE TO RELATED APPLICATIONS

The present application is a Divisional of application Ser. No. 17/299,698, filed Jun. 3, 2021. Application Ser. No. 17/299,698 is a 371 National entry of PCT/EP2019/081261, filed Nov. 14, 2019. Finally, PCT/EP2019/081261 claims priority to EP18210015.6, filed Dec. 4, 2018. All previous applications are hereby incorporated by reference.

TECHNICAL FIELD

The present application relates to a self-assembled monolayer suitable for the modification of electrodes comprised in electronic devices as well as to such electronic devices. The present application also relates to a method for depositing such self-assembled monolayer onto an electrode as well as to the manufacturing of the corresponding devices.

BACKGROUND

Organic electronic materials have established their presence in a wide range of electronic devices, such as organic photodetectors (OPD), organic photovoltaic cells (OPV), organic light emitting diodes (OLEDs) and organic field effect transistors (OFETs), to name a few only. Because they may be deposited onto an underlying substrate by solution processing, organic materials hold the promise of allowing for simplified and highly flexible production, potentially also leading to reduced manufacturing costs.

In order to obtain an efficient organic electronic device, the work function of the electrode materials has to match the energy level of the highest occupied molecular orbital (HOMO) for a p-type organic semiconducting material and of the lowest unoccupied molecular orbital (LUMO) for an n-type organic semiconducting material. Therefore, for a p-type organic electronic device gold, palladium and platinum are suitable electrode materials. Alternatively, silver electrodes have been used in combination with self-assembled monolayers, wherein the self-assembled monolayer brings the work function of the electrode to a level suitable for a p-type organic electronic device.

An overview of the work function of the chemical elements is given in Herbert B. Michaelson, Journal of Applied Physics 48, 4729 (1977); doi: 10.1063/1.323539.

However, on the downside noble metal electrodes add significant cost to the organic electronic device and there is therefore an interest in using lower cost metals as electrode materials.

Copper may, for example, be considered as a potential alternative electrode material because of its good conductivity, relatively low cost and relative ease to use in manufacturing processes. In addition, copper is already widely used in the semiconductor industry.

However, copper is chemically quite reactive and also requires surface modification in order to match the work function of the copper electrode to the respective organic semiconducting material. Such surface modification may, for example, be done by plating the copper surface with silver. Unfortunately, this frequently leads to the formation of silver dendrites, consequently rendering the so-produced electronic devices less efficient or even completely useless.

As alternative electrode material molybdenum may also be used, for example, in combination with a self-assembled monolayer thereon formed by the deposition of octadecyltrichlorosilane and phenethyltrichlorosilane, as disclosed by Dong-Jin Yun and Shi-Woo Rhee in Journal of the Electrochemical Society 155(6) H357-H362 (2008).

Frequently, in organic electronic devices metal oxide electrodes, such as for example indium tin oxide (ITO) electrodes, are used. While good results have been achieved, it seems that these electrodes need to be further modified so as to render their work function better suitable for a p-type organic electronic device.

There is therefore a need in the industry to overcome the drawbacks of these electrodes.

Hence, it is an object of the present application to provide an electrode, which is suitable for use in an organic electronic device, preferably at reduced cost.

It is also an object of the present application to provide for an electrode, the work function of which can be adapted to the respective organic semiconducting materials used in the organic electronic device.

In addition, it is an object of the present application to provide for a compound and/or a method whereby the work function of a metal oxide electrode can be adapted to the requirements of a p-type organic electronic device.

Further, it is an object to provide for an organic electronic device having good, preferably improved, performance, for example electronic performance.

Additionally, it is an object of the present application to provide for a production process for such electrode and such organic electronic device.

SUMMARY

The present inventors have now surprisingly found that the above objects may be attained either individually or in any combination by the organic electronic device and its production method as disclosed herein.

The present application therefore provides for an organic electronic device comprising an electrode, a self-assembled monolayer on said electrode and an organic semiconducting layer on said self-assembled monolayer, wherein said self-assembled monolayer is formed by depositing the reaction product of a compound of the following formula (I)

$$R^1\text{—}SiX_3 \qquad (1)$$

and an alcohol of formula $R^2$—OH onto said electrode, with $R^1$ being at each occurrence independently alkyl having from 1 to 10 carbon atoms, said alkyl being substituted with at least one electron-withdrawing group $R^4$, or aryl having from 6 to 30 aromatic carbon ring atoms, said aryl being substituted with at least one electron-withdrawing group; $R^2$ being an alkyl group having from 1 to 10 carbon atoms; and X being at each occurrence independently halogen or alkoxy having from 1 to 10 carbon atoms.

Further, the present application also provides for a method of producing the organic electronic device of any one or more of claims 1 to 12, said method comprising the steps of
 (a) providing an electrode, optionally on a substrate;
 (b) depositing onto said electrode a formulation comprising a compound of formula (I)

$$R^1\text{—}SiX_3 \qquad (1)$$

and an alcohol of formula $R^2$—OH, with $R^1$ being at each occurrence independently alkyl having from 1 to 10 carbon atoms, said alkyl being substituted with at least one electron-withdrawing group $R^4$, or aryl having from 6 to 30 aromatic carbon ring atoms, said aryl being substituted with at least one electron-withdrawing group $R^4$; $R^2$ being an alkyl group having from 1 to 10 carbon atoms; and X being at each occurrence independently halogen or alkoxy having from 1 to 10 carbon atoms, to obtain a self-assembled monolayer; and (c) depositing onto said self-assembled monolayer an organic semiconducting material to obtain an organic semiconducting layer.

DETAILED DESCRIPTION OF THE INVENTION

Figure 1:
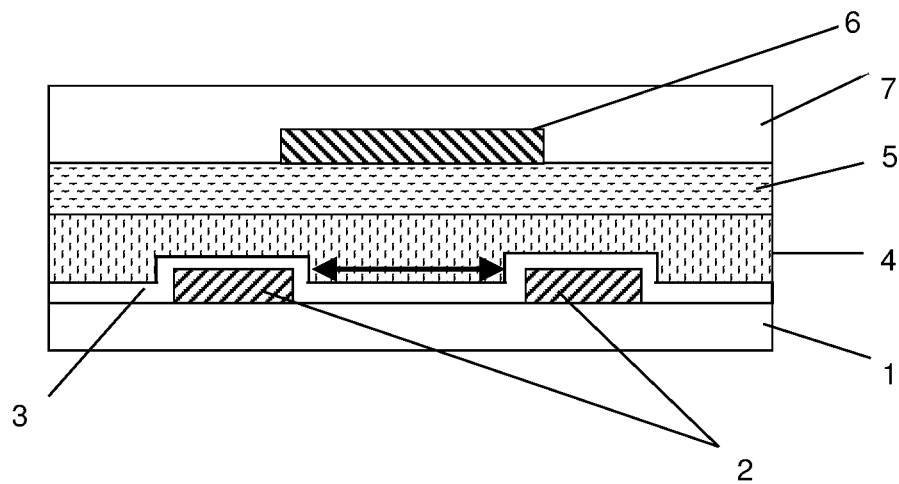
FIG. 1 shows a schematic representation of an exemplary top gate OFET in accordance with the present application.

As used herein, the term "organic electronic device" refers to an electronic device comprising an organic semiconducting layer, i.e. a semiconducting layer comprising at least 50 wt % (e.g. 60 wt % or 70 wt % or 80 wt % or 90 wt % or 95 wt % or 97 wt % or 99.0 wt % or 99.5 wt % or 99.7 wt % or 99.9 wt %), with wt % relative to the total weight of said semiconducting layer, and preferably consists of one or more organic semiconducting material.

As used herein, the terms "consist of" and "consisting of" do not exclude the presence of impurities, which may normally be present, for example but in no way limited to, impurities resulting from the synthesis of a compound (e.g. an organic semiconducting material) or-in case of metals-trace metals.

For the purposes of the present application, an asterisk "*" is used to denote a linkage to an adjacent unit or group, including for example, in case of a polymer, to an adjacent repeating unit or any other group. In some instances, where specifically identified as such, the asterisk "*" may also denote a mono-valent chemical group.

In general terms the present application relates to an organic electronic device. Said organic electronic device comprises an electrode, a self-assembled monolayer and an organic semiconducting layer, wherein the self-assembled monolayer is (or is formed) on the electrode, and wherein the organic semiconducting layer is on (or is deposited onto) the self-assembled monolayer. Expressed differently, the organic electronic device comprises an electrode, a self-assembled monolayer and an organic semiconducting layer, with the self-assembled monolayer between the electrode and the organic semiconducting layer.

The electrode comprises a metal or an electrically conductive metal oxide or a blend thereof, preferably in at least 50 wt % (for example in at least 60 wt % or 70 wt % or 80 wt % or 90 wt % or 95 wt % or 97 wt % or 99.0 wt % or 99.5 wt % or 99.7 wt % or 99 wt %), with wt % relative to the total weight of said electrode, and most preferably consists of the metal or the electrically conductive metal oxide or a blend thereof.

It is noted that the term "metal" as used herein also includes the possibility of a blend of two or more metals. It is also noted that the term "electrically conductive metal oxide" as used herein also includes the possibility of a blend of two or more metal oxides and/or the possibility of mixed metal oxides.

Said metal is not particularly limited. Metals generally suitable may, for example, be selected from the group consisting of chromium, molybdenum, tungsten, cobalt, rhodium, iridium, nickel, palladium, platinum, gold, silver, and any blend of any of these, with chromium, molybdenum and tungsten being preferred, and molybdenum being most preferred.

Said metal oxide is not particularly limited, it is nevertheless preferred that the electrically conductive metal oxide is selected from the group consisting of indium tin oxide (ITO), molybdenum oxide, tin oxide, and any blend of any of these.

The self-assembled monolayer essentially covers the electrode. In this context the term "essentially covers" is used to denote that—depending upon the architecture of the respective organic electronic device—the self-assembled monolayer covers the electrode in such a way that preferably no part of the electrode is in direct physical contact with the organic semiconducting layer; or that the self-assembled monolayer covers the entire surface of the electrode, preferably the entire surface of the electrode facing the organic semiconducting layer; or that the self-assembled monolayer covers the part of the surface of the electrode that is active in the change transfer.

The self-assembled monolayer is formed by depositing a formulation comprising a compound of the following formula (I)

$$R^1\text{—}SiX_3 \qquad (I)$$

and an alcohol of formula $R^2$—OH, with $R^1$, $R^2$ and X as defined herein, onto said electrode.

$R^2$ is an alkyl group having from 1 to 10 carbon atoms. Preferably, $R^2$ is an alkyl group having from 1 to 5 carbon atoms. Examples of such preferred groups $R^2$ may be selected from the group consisting of methyl, ethyl, n-propyl, iso-propyl, n-butyl, iso-butyl, tert-butyl and n-pentyl. It is most preferred that $R^2$ is iso-propyl.

Without wishing to be bound by theory it is believed that the compound of formula (I) reacts with the alcohol of formula $R^2$—OH to form compounds of the following formula (I-a) to (I-c)

$$R^1\text{—}SiX_2(OR^2) \qquad (I\text{-}a)$$

$$R^1\text{—}SiX(OR^2)_2 \qquad (I\text{-}b)$$

$$R^1\text{—}Si(OR^2)_3 \qquad (I\text{-}c)$$

of which formula (I-c) is, without wishing to be bound by theory, considered the majority compound, possibly even the sole compound.

Thus, consequently, without wishing to be bound by theory, it is believed that the self-assembled monolayer may actually be formed by depositing the reaction product of the compound of formula (I) and the alcohol of formula $R^2$—OH, for example by depositing any one or more of compounds (I-a) to (I-c), preferably of compound (I-c) predominantly or even solely.

X is at each occurrence independently halogen, preferably Cl, or an alkoxy group having from 1 to 10 carbon atoms. Preferably the alkoxy group is —O—$C_aH_{2a+1}$ with a being an integer of at least 1 and of at most 10, preferably of at least 1 and of at most 5. Examples of preferred alkoxy groups may be selected from the group consisting of —O—$CH_3$, —O—$CH_2$—$CH_3$, —O—$(CH_2)_2$—$CH_3$, —O—$CH(CH_3)_2$, —O—$(CH_2)_3$—$CH_3$, —O—$C(CH_3)$, and —O—$CH_2$—$CH(CH_3)_2$. A particularly preferred alkoxy group is —O—$CH(CH_3)_2$.

$R^1$ is at each occurrence independently alkyl having from 1 to 10 carbon atoms, said alkyl being substituted with at least one electron-withdrawing group $R^4$, or aryl having from 6 to 30 aromatic carbon ring atoms, said aryl being substituted with at least one electron-withdrawing group $R^4$.

Preferably $R^1$ is at each occurrence independently a group of any one of the following formulae (II-a) or (II-b)

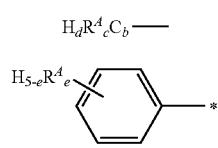

(II-a)

(II-b)

wherein
b is at each occurrence independently an integer of at least 1 and of at most 10, preferably of at most 5;
c is at each occurrence an integer of at least 1 and at most 2b+1, and preferably is 2b+1;
d is at each occurrence an integer of at least 0 and at most 2b, and preferably is 0; with the provision that the sum of c and d is 2b+1, i.e. c+d=2b+1;
e is at each occurrence independently an integer of at least 1 and of at most 5, and preferably is 5;
and $R^4$ is an electron-withdrawing group as defined herein.

$R^4$ is an electron withdrawing group. Preferably $R^4$ is at each occurrence independently selected from the group consisting of —$NO_2$, —CN, —F, —Cl, —Br, —I, —$OAr^2$, —$OR^3$, —$COR^3$, —SH, —$SR^3$, —OH, —C≡$CR^3$, —CH=$CR^3_2$, and alkyl having from 1 to 10 carbon atoms, wherein one or more, preferably all, hydrogen atoms are replaced by F, with $Ar^2$ and $R^3$ as defined herein. More preferably $R^4$ is at each occurrence independently selected from the group consisting of —CN, —F, —Cl, —Br, —I, —$OR^3$, and alkyl having from 1 to 10 carbon atoms, wherein one or more, preferably all, hydrogen atoms are replaced by F, with $R^3$ as defined herein. Even more preferably $R^4$ is at each occurrence independently selected from the group consisting of —F, —$OR^3$, and alkyl having from 1 to 10 carbon atoms, wherein one or more, preferably all, hydrogen atoms are replaced by F, with $R^3$ as defined herein. Most preferably $R^4$ is F.

$Ar^2$ is an aryl having from 6 to 30 carbon atoms, preferably having from 6 to 20 carbon atoms, and most preferably is phenyl. Preferably $Ar^2$ is substituted with one or more substituent selected from the group consisting of —CN, —F, —Cl, —Br, —I, —$OR^3$, and alkyl having from 1 to 10, preferably from 1 to 5, carbon atoms, wherein one or more, preferably all, hydrogen atoms are replaced by F, with $R^3$ as defined herein.

$R^3$ is an alkyl having from 1 to 10, preferably from 1 to 5, carbon atoms, or alkyl having from 1 to 10, preferably from 1 to 5, carbon atoms, wherein one or more, preferably all, hydrogen atoms are replaced by F.

Preferred examples of alkyl suitable as $R^3$ may be selected from the group consisting of methyl, ethyl, n-propyl, iso-propyl, n-butyl, iso-butyl, tert-butyl and n-pentyl. Preferred examples of fluorinated alkyl (i.e. alkyl wherein one or more, preferably all, hydrogen atoms are replaced by F) suitable as $R^3$ may be selected from the group consisting of —$CF_3$, —$C_2F_5$, -n-$C_3F_7$ (i.e. n-propyl), and -n-$C_4F_9$ (i.e. n-butyl).

Preferred examples of the compound of formula (I) may be selected from the group consisting of the following formulae (I-1) to (I-11)

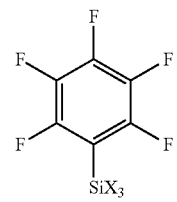

(I-1)

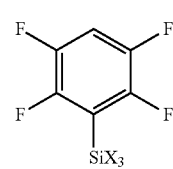

(I-2)

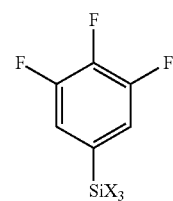

(I-3)

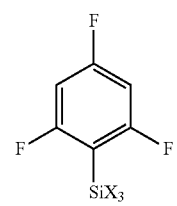

(I-4)

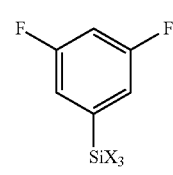

(I-5)

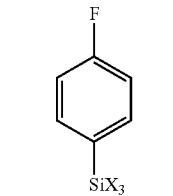

(I-6)

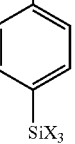

(I-7)

(I-8)

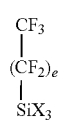

(I-9)

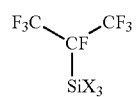

(I-10)

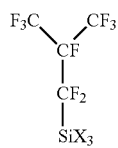
(I-11)

with X as defined herein, and e being an integer of at least 1 and at most 10 (for example 1, 2, 3, 4, 5, 6, 7, 8, 9 or 10).

Without wishing to be bound by theory it is believed that the deposition of a compound of formula (I) onto the electrode will result in the formation of one or more —Si—O—M— bonds (with M being a metal atom comprised in the electrode).

Preferably the self-assembled monolayers of the present invention may have a thickness (measured perpendicular to the surface of such layer) from 1 to 10, more preferably from 1 to 5, even more preferably from 1 to 3, and still even more preferably from 1 to 2 molecular layers. Most preferably said thickness is about one molecular layer.

The organic semiconducting material is not particularly limited. Any organic semiconducting material may be used, such as for example so-called "small molecules" or polymers. The term "small molecules" refers to organic semiconducting compounds that generally have a molecular weight of at most 1000 g mol$^{-1}$, preferably of at most 500 g mol$^{-1}$.

The organic semiconducting material can either be an n-type or p-type semiconducting material. Preferably, said organic semiconducting material has a field effect transistor mobility of at least $1 \cdot 10^{-5}$ cm$^2$ V$^{-1}$ s$^{-1}$.

Preferably the organic semiconducting layer is solid. Preferably the semiconducting layer comprises, and preferably consists of, one or more, preferably one, organic semiconducting material. Preferably, said semiconducting material has a transistor mobility of at least $1 \cdot 10^{-5}$ cm$^2$ V$^{-1}$ s$^{-1}$ and/or the energy level of the highest occupied molecular orbital (HOMO) of the semiconducting material is lower than the lower of the Fermi energy levels of the first and second electrode materials.

The semiconducting layer preferably has a thickness of at least 5 nm, more preferably of at least 10 nm, and of at most 20 μm, more preferably of at most 15 μm and most preferably of at most 10 μm.

The organic semiconducting material is preferably selected from the group consisting of monomeric compounds (also referred to as "small molecule"), oligomers, polymers or blends of any of these, for example, including but not limited to blends of one or more monomeric compounds, one or more oligomers or one or more polymers. More preferably the organic semiconducting material is a polymer or a blend of polymers. Most preferably the organic semiconducting material is a polymer.

The type of organic semiconducting material is not particularly limited. In general the organic semiconducting material comprises a conjugated system. The term "conjugated system" is herein used to denote a molecular entity or a part of a molecular entity, the structure of which may be represented as a system of alternating single and multiple bonds (see also International Union of Pure and Applied Chemistry, Compendium of Chemical Terminology, Gold Book, Version 2.3.3, 2014 Feb. 24, pages 322-323).

An organic semiconducting material suited for use herein may, for example, be represented by the following formula (V)

wherein monomeric unit M and m are as defined herein. At each occurrence M may be selected independently.

With regards to formula (V) m may be any integer from 1 to 100,000. For a monomer or monomeric unit m is 1. For an oligomer m is at least 2 and at most 10. For a polymer m is at least 11.

Preferably, the organic semiconducting material comprises one or more aromatic units. Expressed differently, with regards to formula (V), M may be an aromatic unit. Such aromatic units preferably comprise two or more, more preferably three or more aromatic rings. Such aromatic rings may, for example, at each occurrence independently be selected from the group consisting of 5-, 6-, 7-and 8-membered aromatic rings, with 5-and 6-membered rings being particularly preferred.

These aromatic rings comprised in the organic semiconducting material optionally comprise one or more heteroatoms selected from Se, Te, P, Si, B, As, N, O or S, preferably from Si, N, O or S. Further, these aromatic rings may optionally be substituted with alkyl, alkoxy, polyalkoxy, thioalkyl, acyl, aryl or substituted aryl groups, halogen, with fluorine being the preferred halogen, cyano, nitro or an optionally substituted secondary or tertiary alkylamine or arylamine represented by —N(R')(R"), where R' and R" are each independently H, an optionally substituted alkyl or an optionally substituted aryl, alkoxy or polyalkoxy groups are typically employed. Further, where R' and R" is alkyl or aryl these may be optionally fluorinated.

The aforementioned aromatic rings can be fused rings or linked to each other by a conjugated linking group such as —C(T$_1$)=C(T$_2$)—, —C=C—, —N(R'")—, —N=N—, (R")=N—, —N=C(R")—, where T$_1$ and T$_2$ each independently represent H, Cl, F, —C=N or lower alkyl groups such as C$_{1-4}$ alkyl groups; R'" represents H, optionally substituted alkyl or optionally substituted aryl. Further, where R'" is alkyl or aryl, it may be optionally fluorinated.

Further preferred organic semiconducting materials may be polymers or copolymers wherein the monomeric units M of formula (V) may at each occurrence be independently selected from the group consisting of formulae (A1) to (A83) and (D1) to (D142)

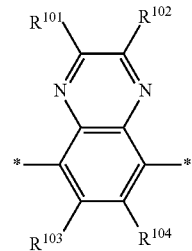
(A1)

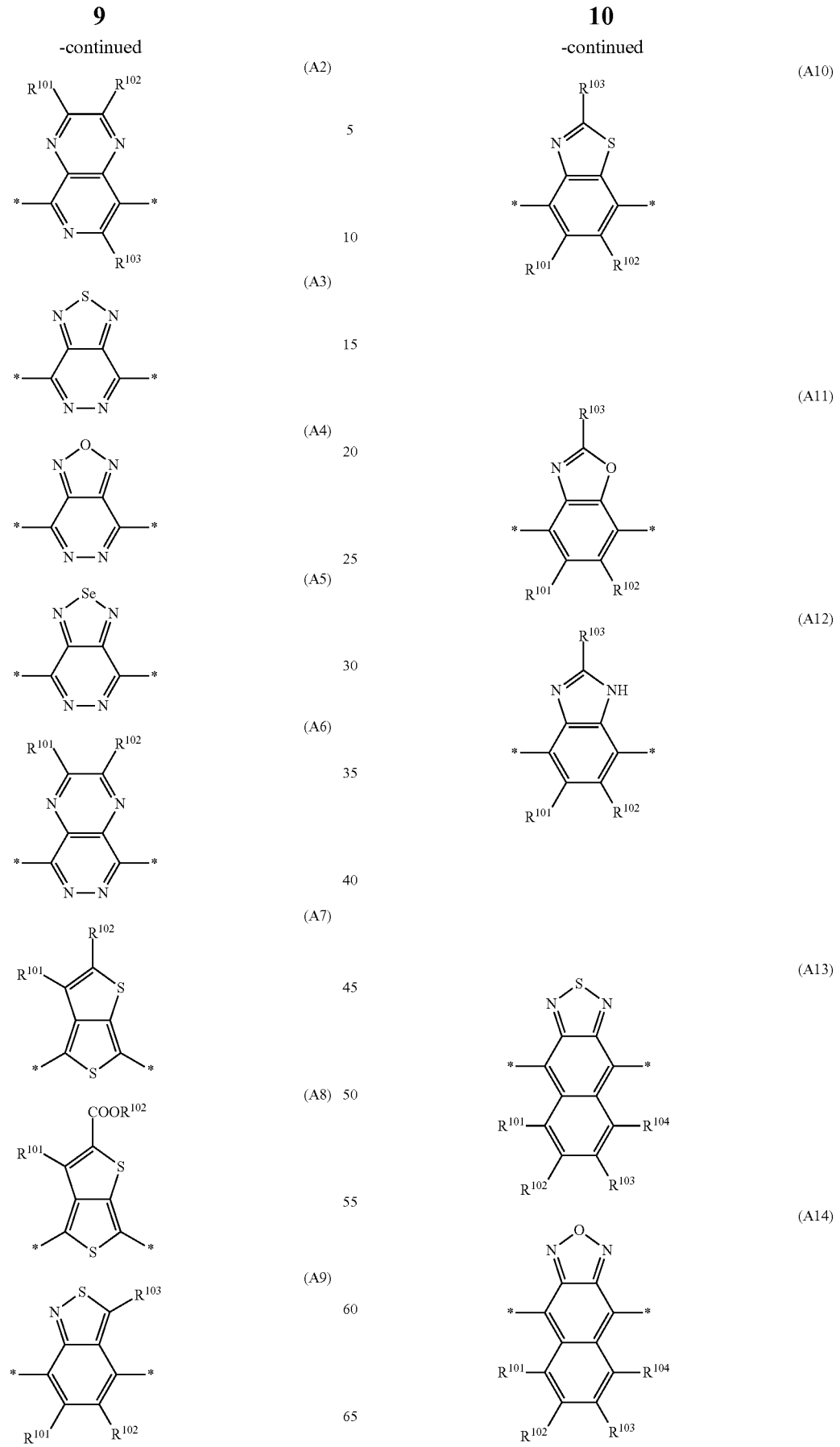

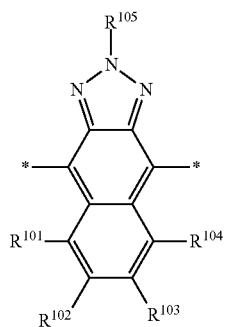
(A15)
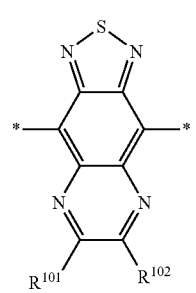
(A16)
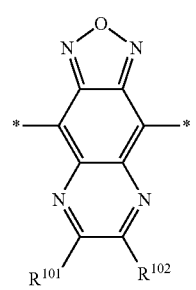
(A17)
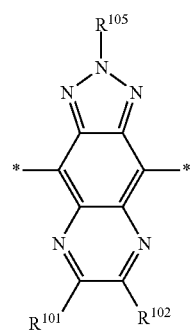
(A18)
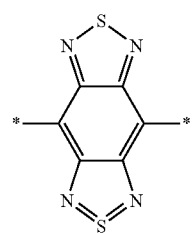
(A19)
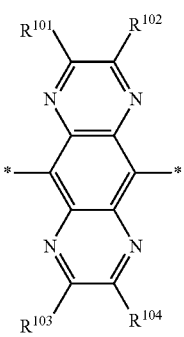
(A20)
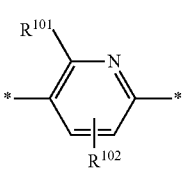
(A21)
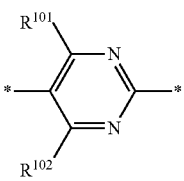
(A22)
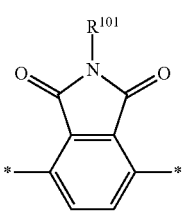
(A23)
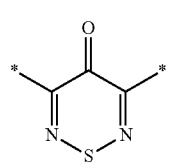
(A24)
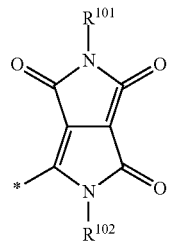
(A25)
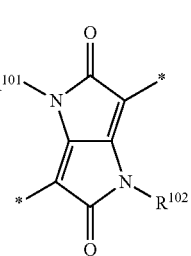
(A26)

-continued
(A27) 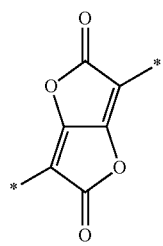
(A28) 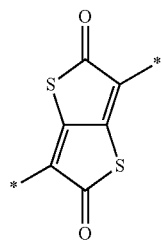
(A29) 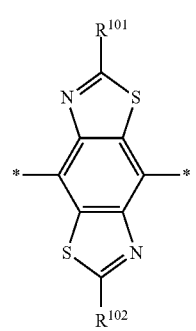
(A30) 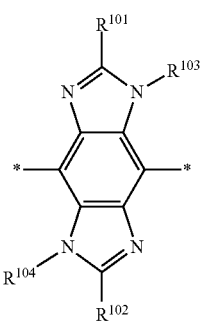
(A31) 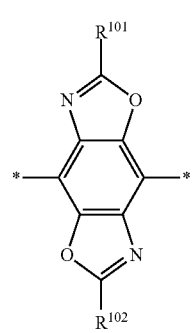
-continued
(A32) 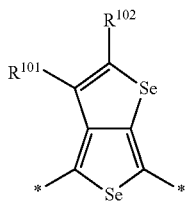
(A33) 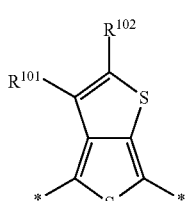
(A34) 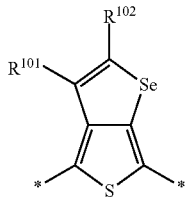
(A35) 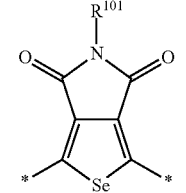
(A36) 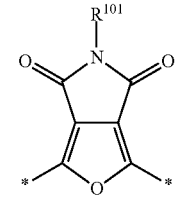
(A37) 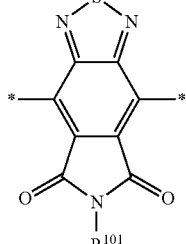
(A38) 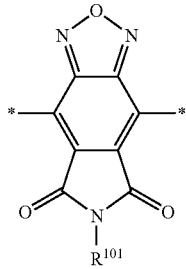

(A39) 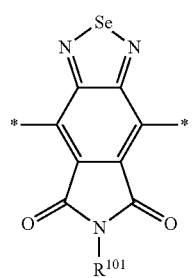
(A40) 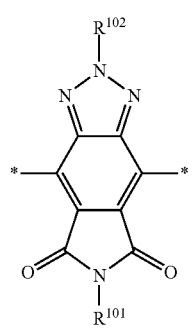
(A41) 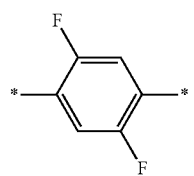
(A42) 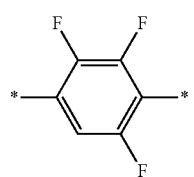
(A43) 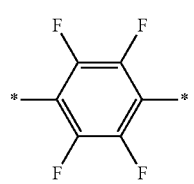
(A44) 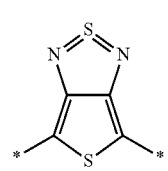
(A45) 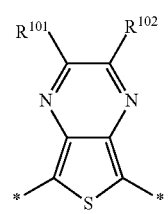
(A46) 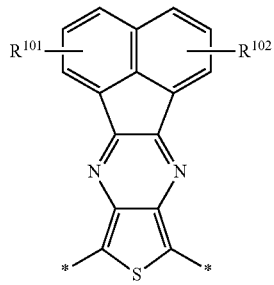
(A47) 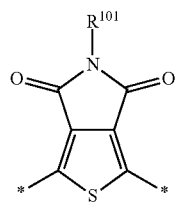
(A48) 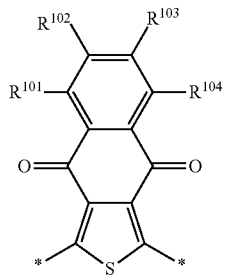
(A49) 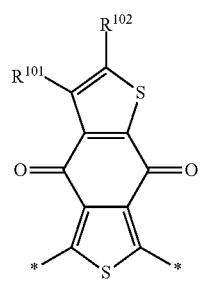
(A50) 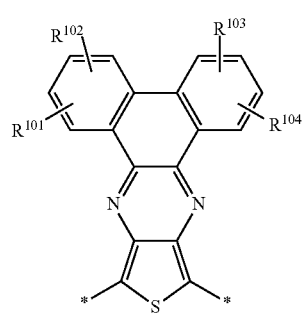
(A51) 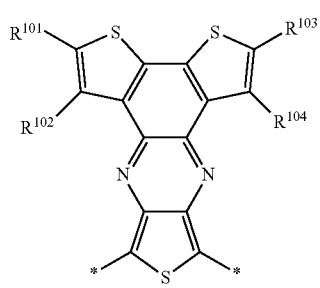

-continued
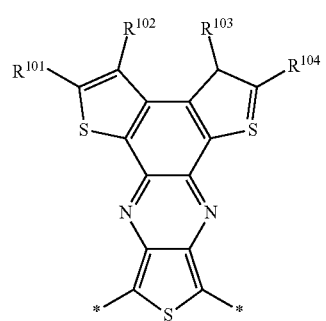
(A52)
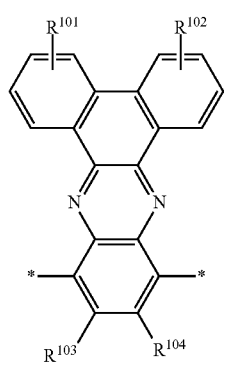
(A53)
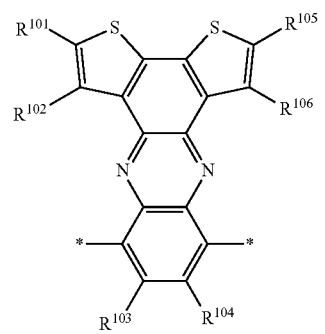
(A54)
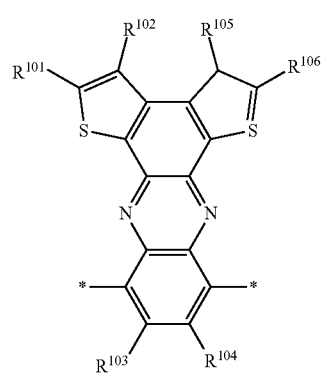
(A55)
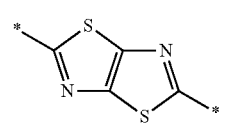
(A56)
-continued
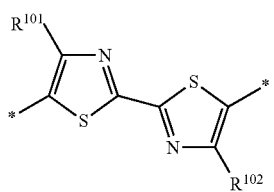
(A57)
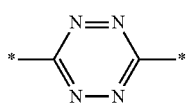
(A58)
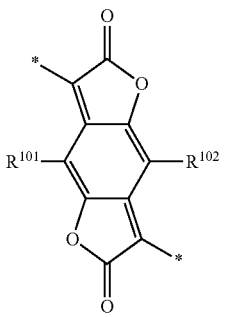
(A59)
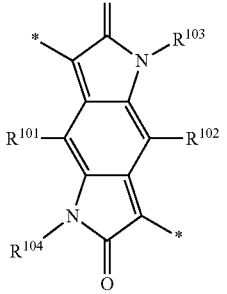
(A60)
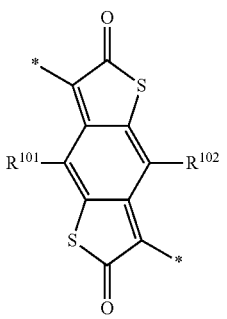
(A61)
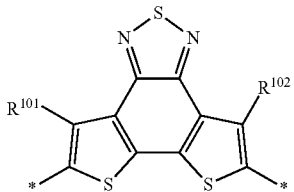
(A62)

-continued
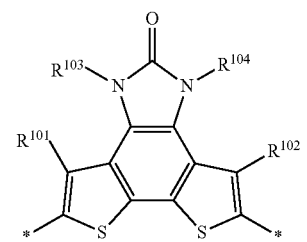 (A63)
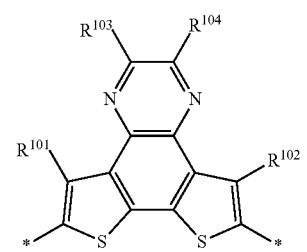 (A64)
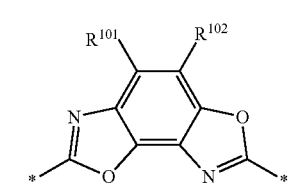 (A65)
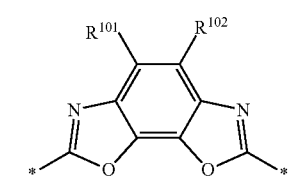 (A66)
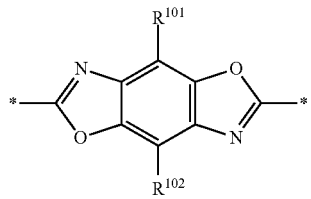 (A67)
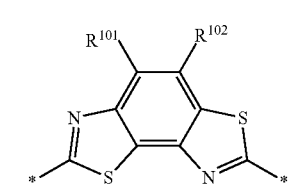 (A68)
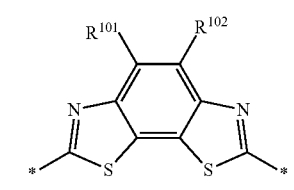 (A69)
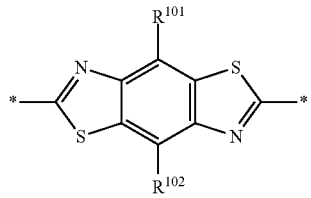 (A70)
-continued
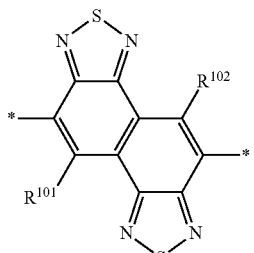 (A71)
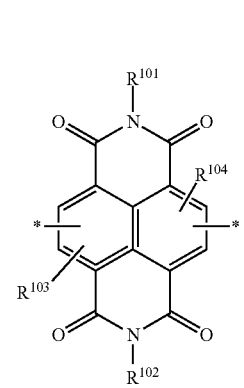 (A72)
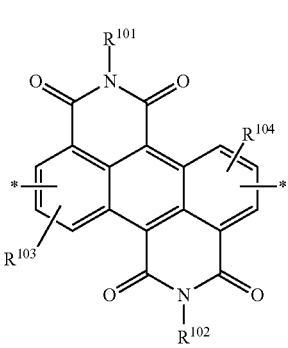 (A73)
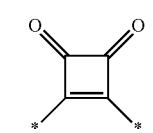 (A74)
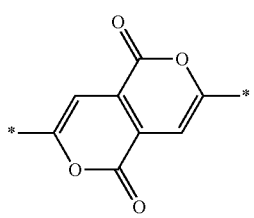 (A75)
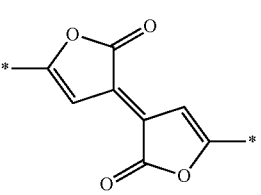 (A76)

-continued
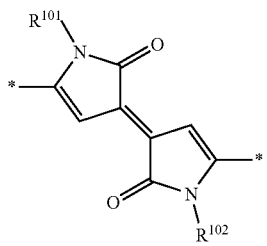
(A77)
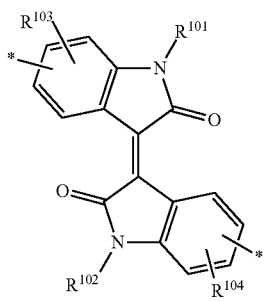
(A78)
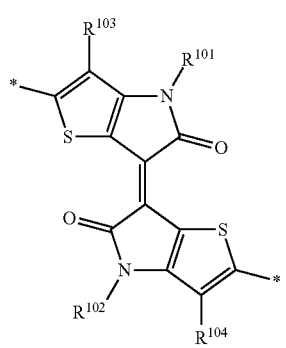
(A79)
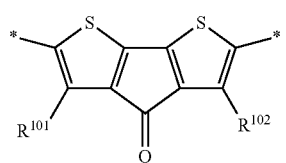
(A80)
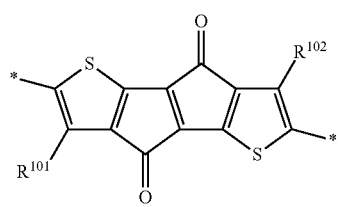
(A81)
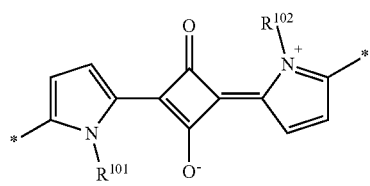
(A82)
-continued
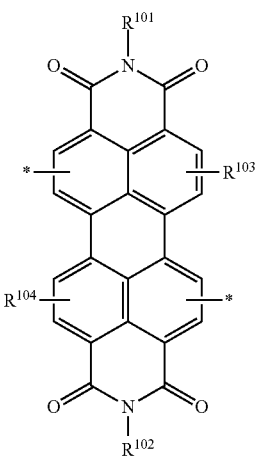
(A83)
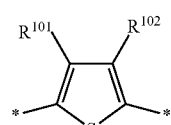
(D1)
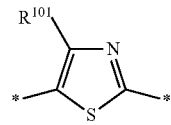
(D2)
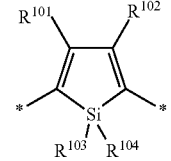
(D3)
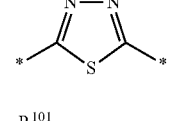
(D4)
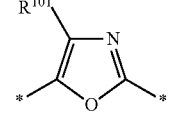
(D5)
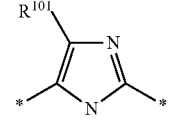
(D6)
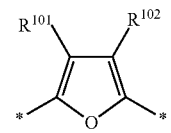
(D7)
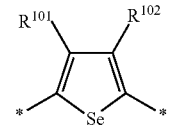
(D8)

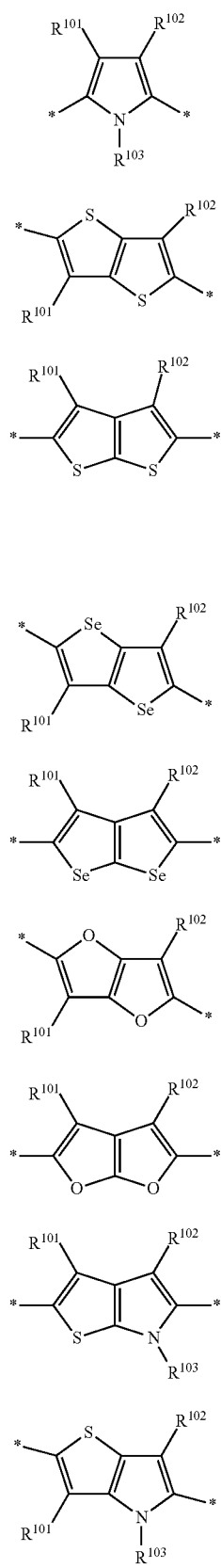
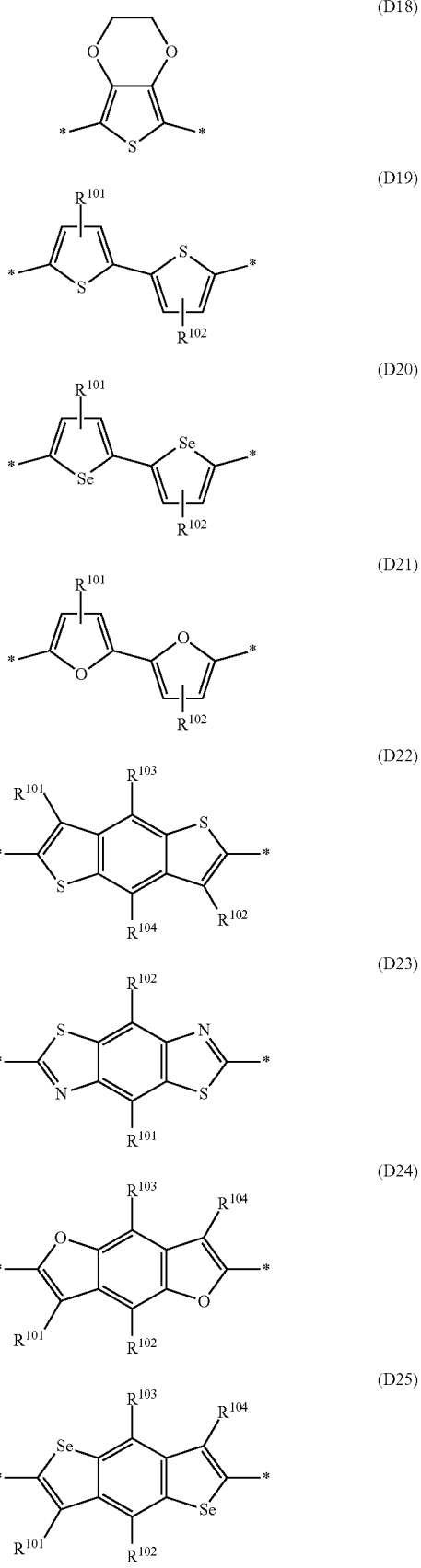

-continued
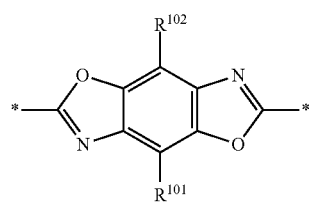
(D26)
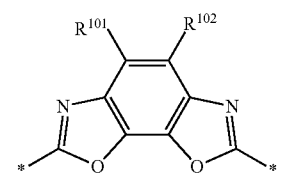
(D27)
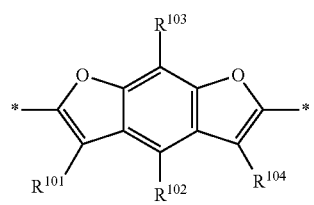
(D28)
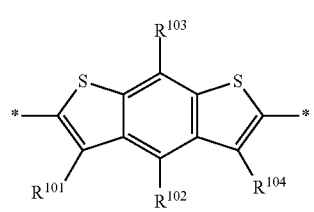
(D29)
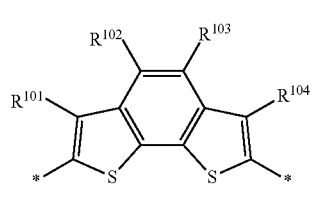
(D30)
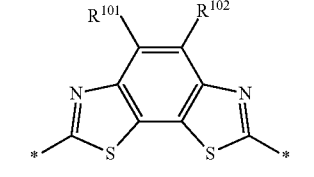
(D31)
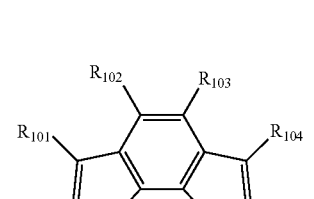
(D32)
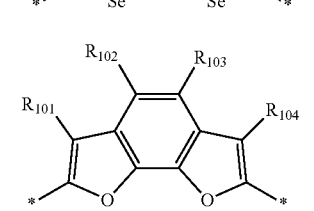
(D33)
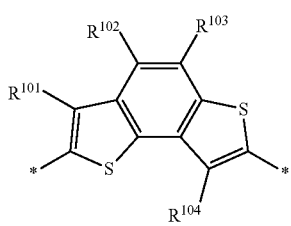
(D34)
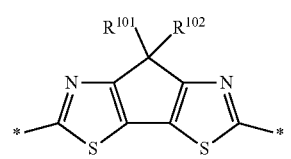
(D35)
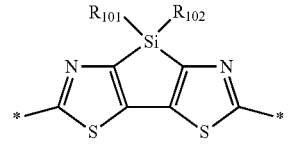
(D36)
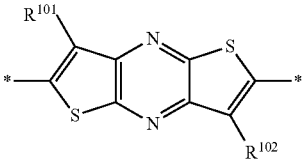
(D37)
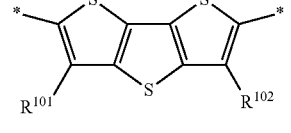
(D38)
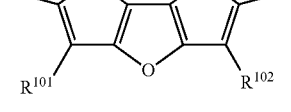
(D39)
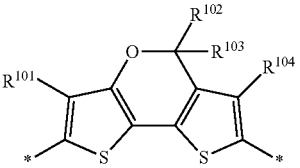
(D40)
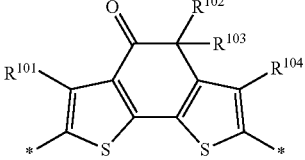
(D41)
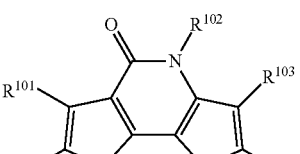
(D42)

-continued
(D43)
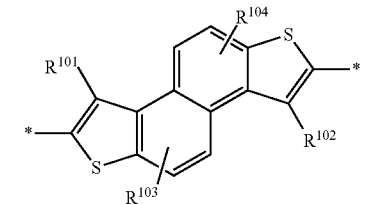
(D44)
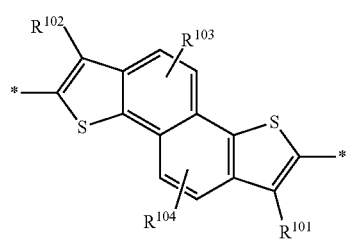
(D45)
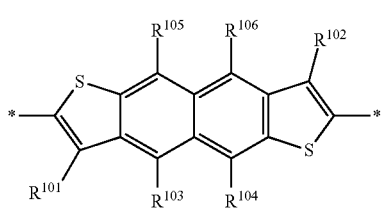
(D46)
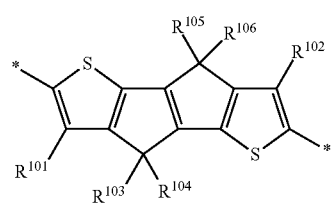
(D47)
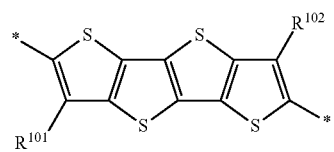
(D48)
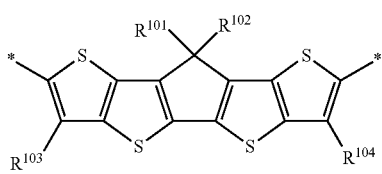
(D49)
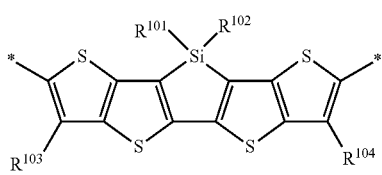
(D50)
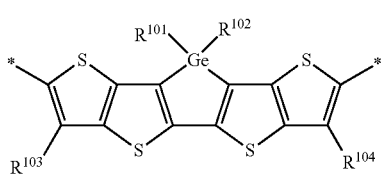
-continued
(D51)
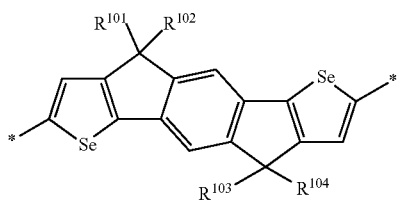
(D52)
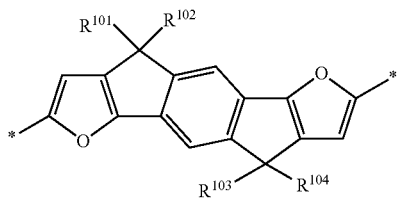
(D53)
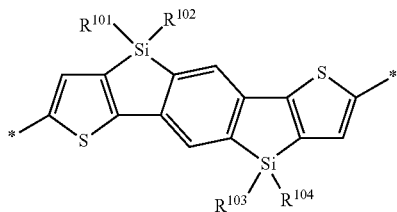
(D54)
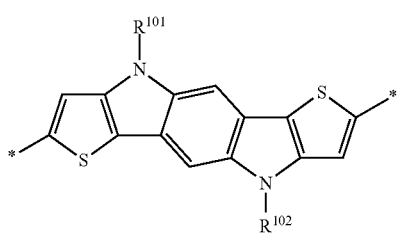
(D55)
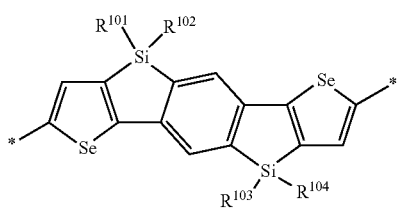
(D56)
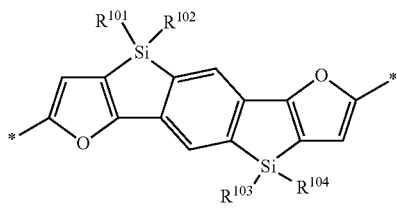
(D57)
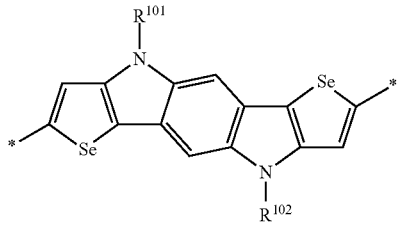

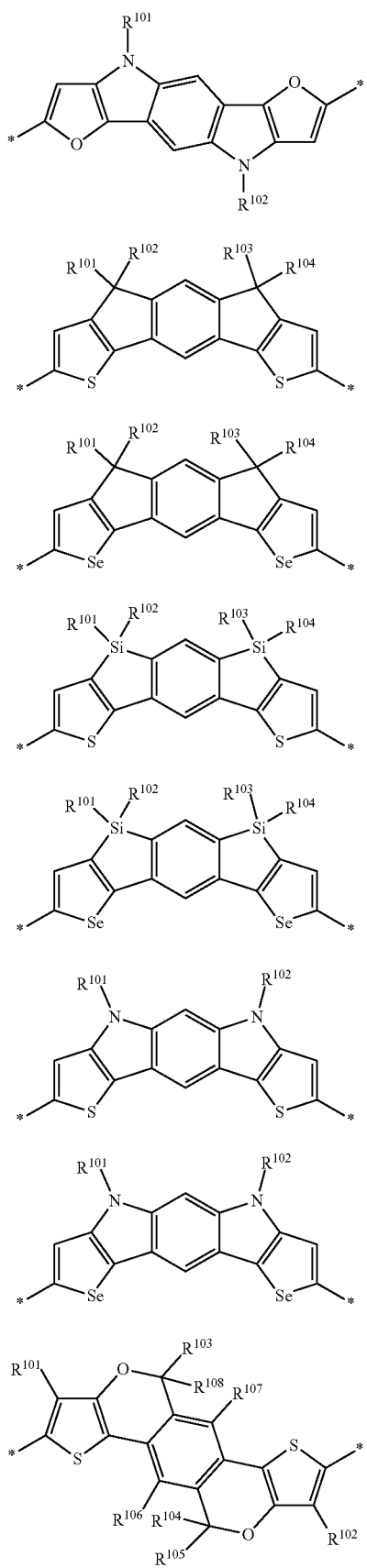
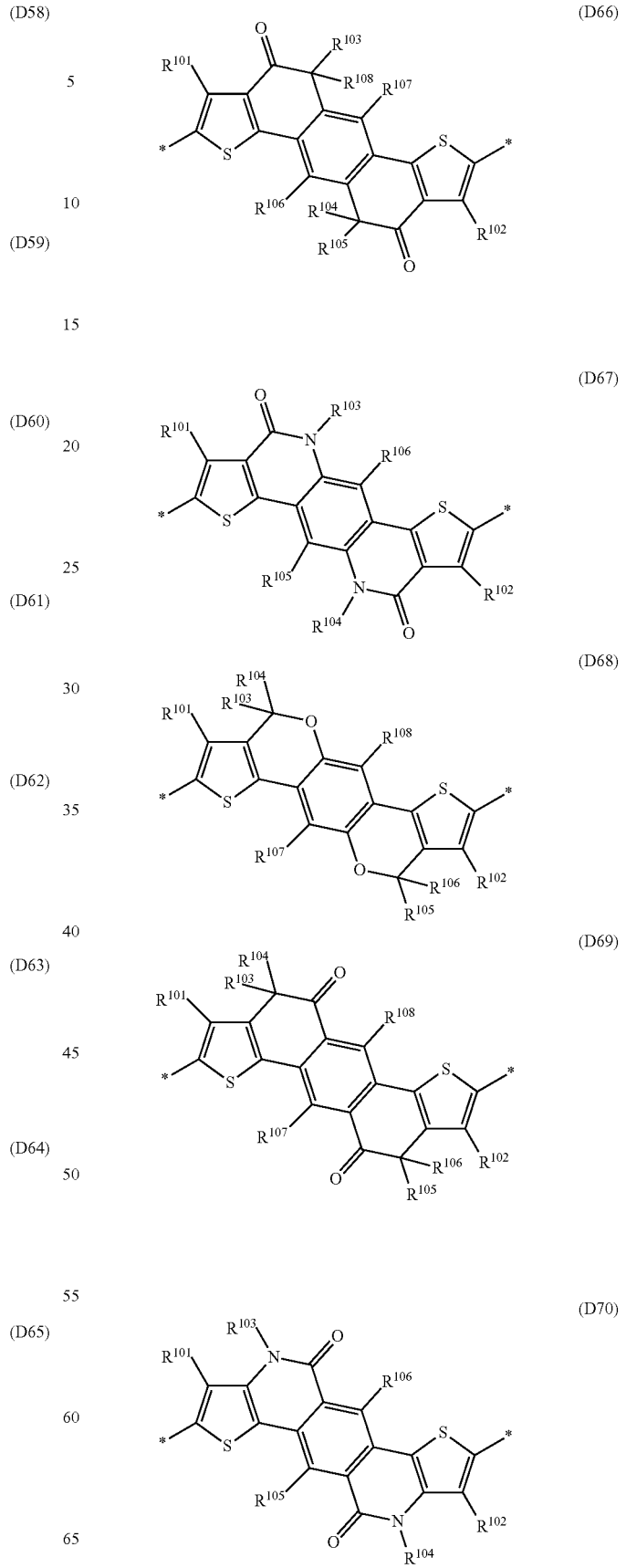

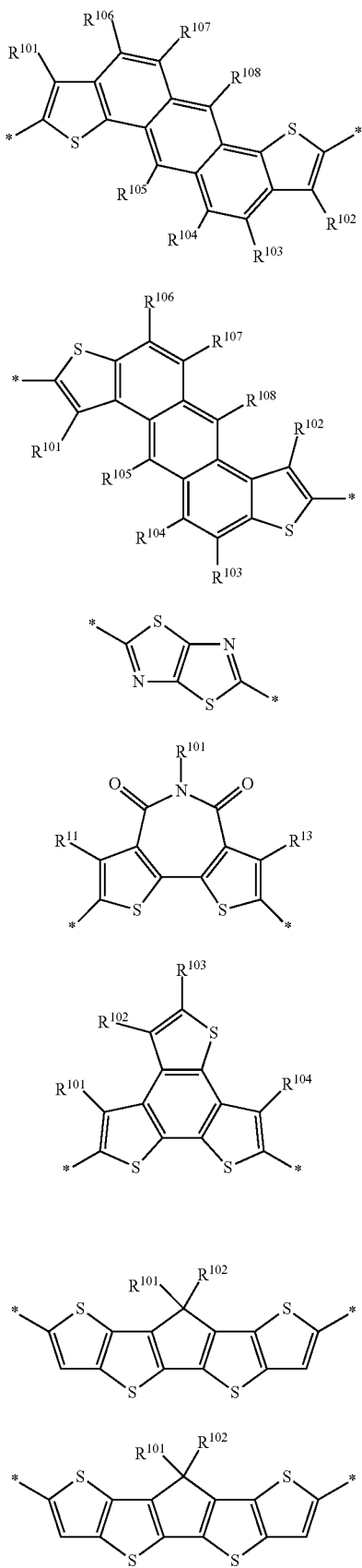
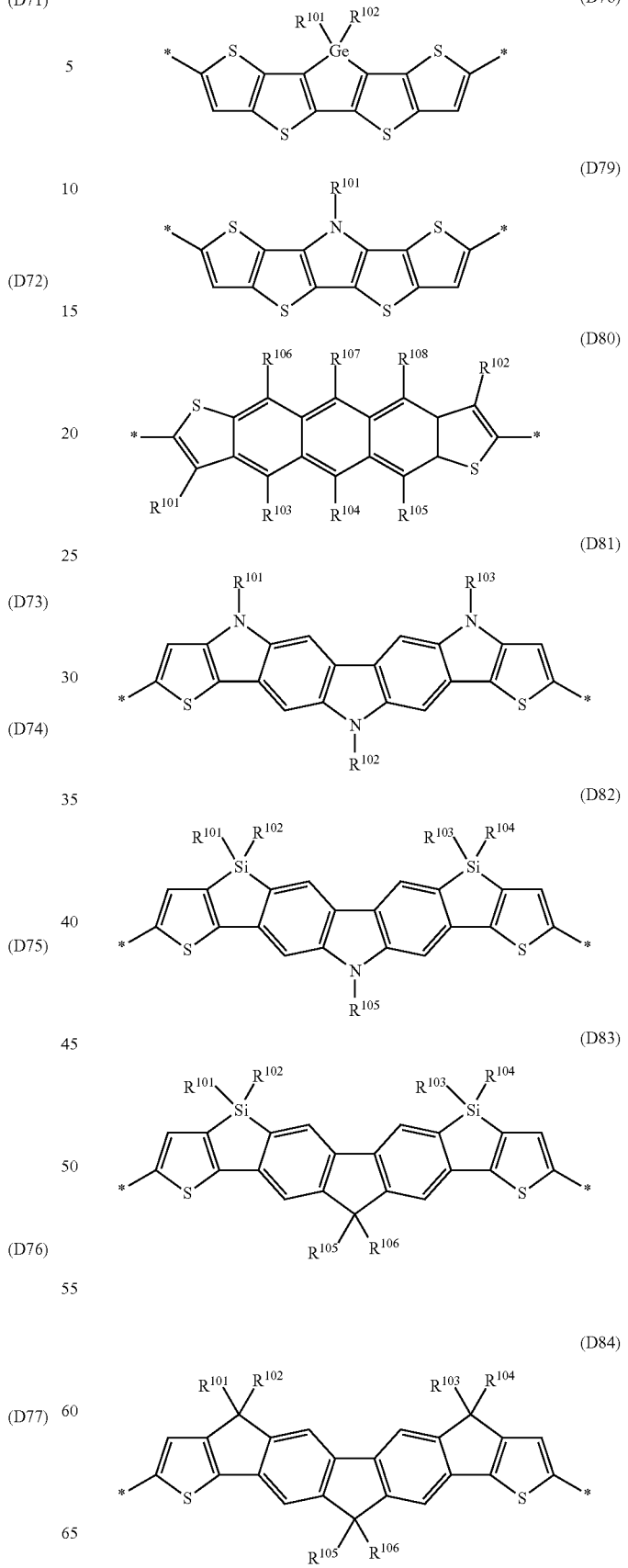

(D85) 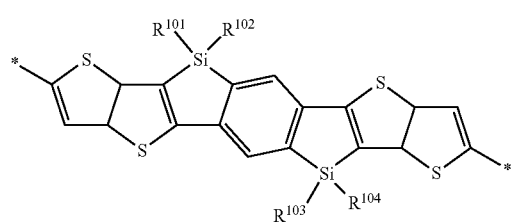
(D86) 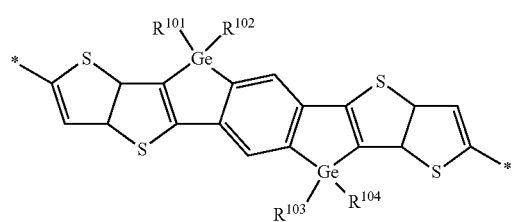
(D87) 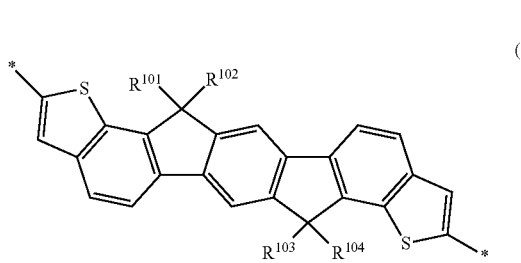
(D88) 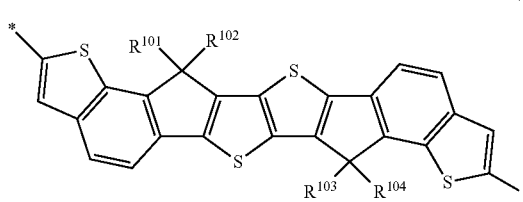
(D89) 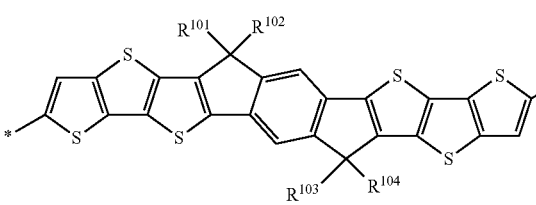
(D90) 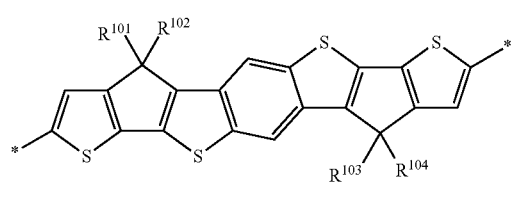
(D91) 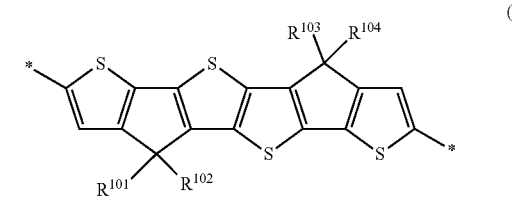
(D92) 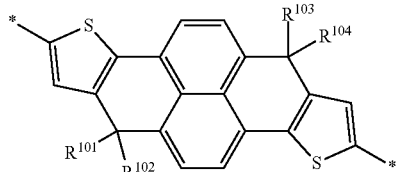
(D93) 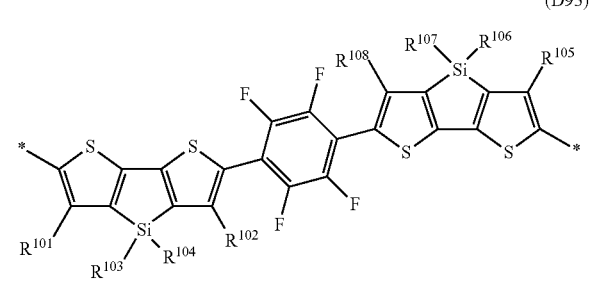
(D94) 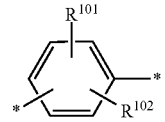
(D95) 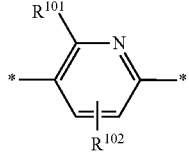
(D96) 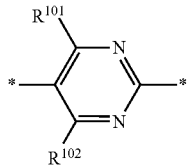
(D97) 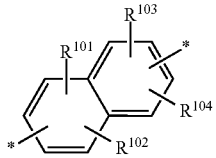
(D98) 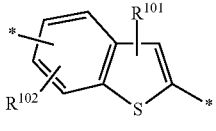
(D99) 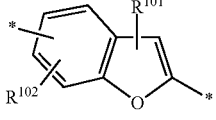
(D100) 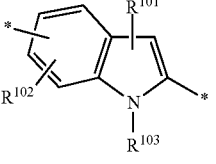

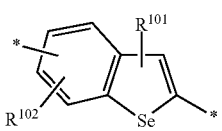 (D101)
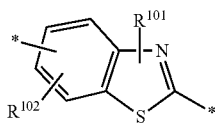 (D102)
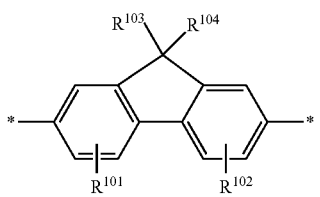 (D103)
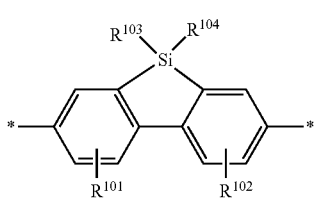 (D104)
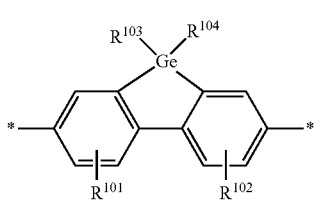 (D105)
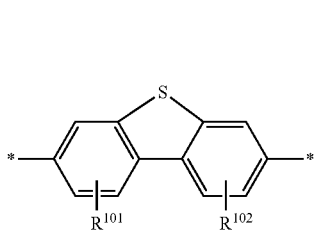 (D106)
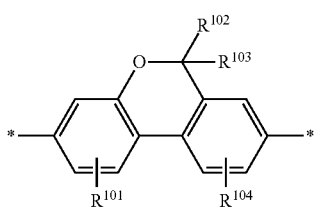 (D107)
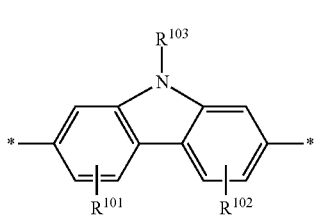 (D108)
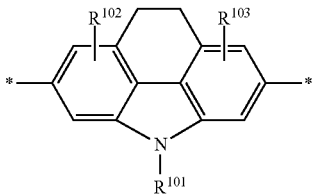 (D109)
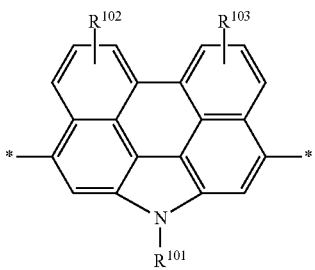 (D110)
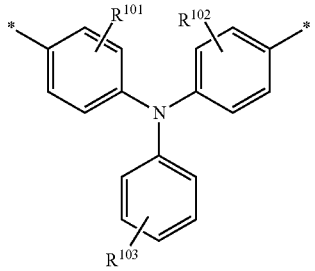 (D111)
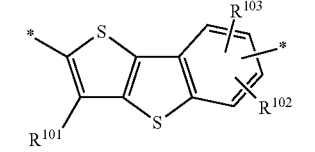 (D112)
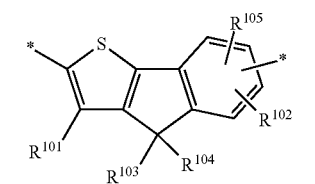 (D113)
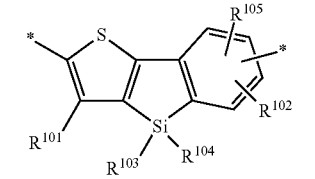 (D114)
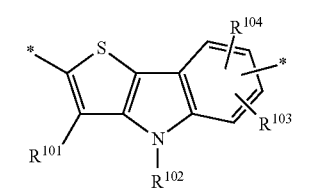 (D115)

(D116) 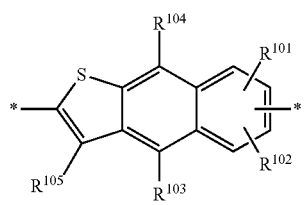
(D117) 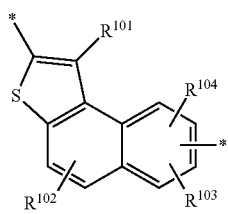
(D118) 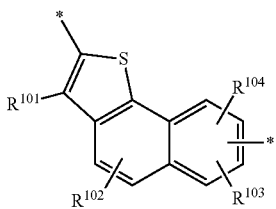
(D119) 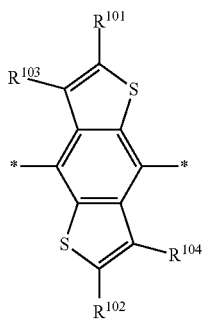
(D120) 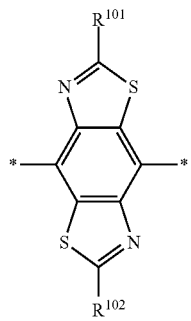
(D121) 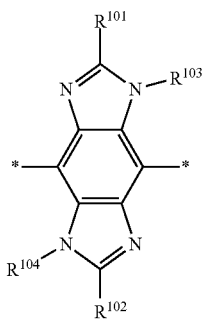
(D122) 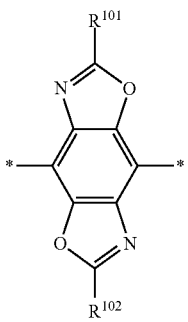
(D123) 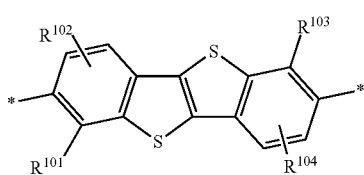
(D124) 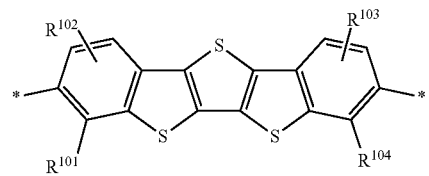
(D125) 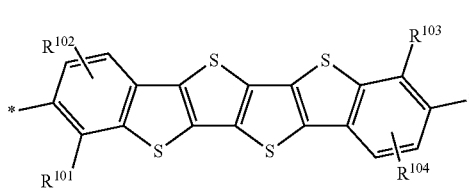
(D126) 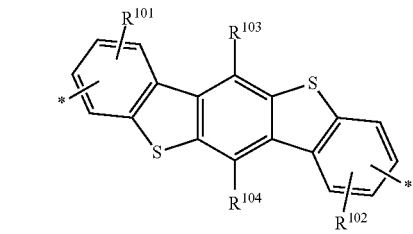
(D127) 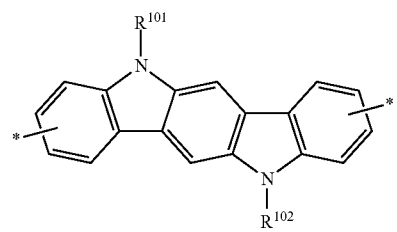
(D128) 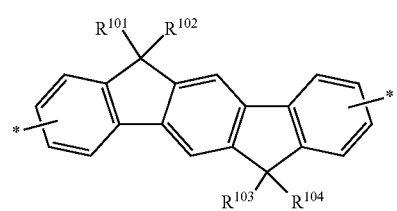

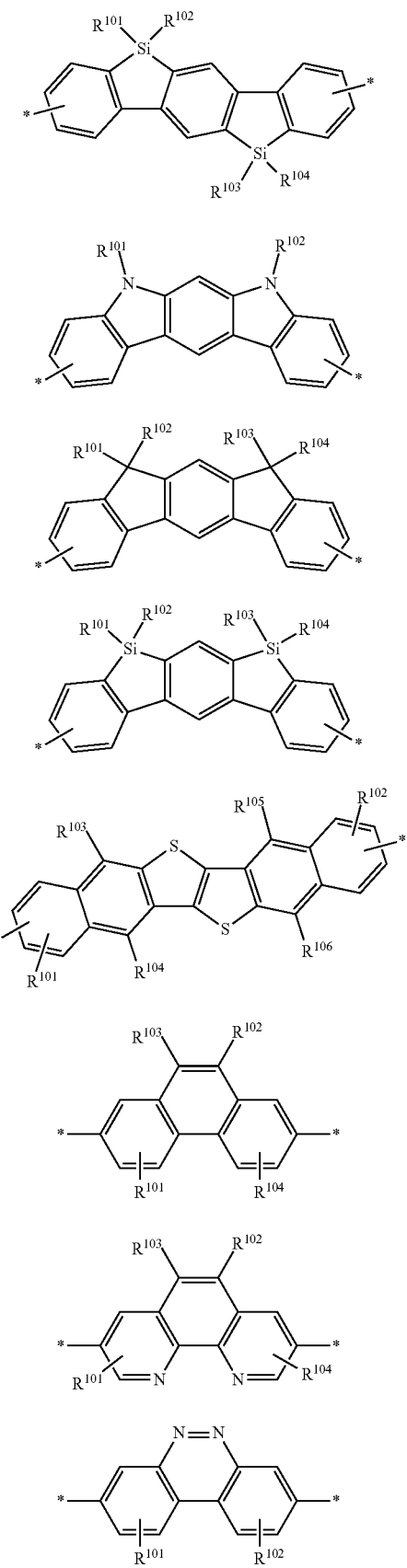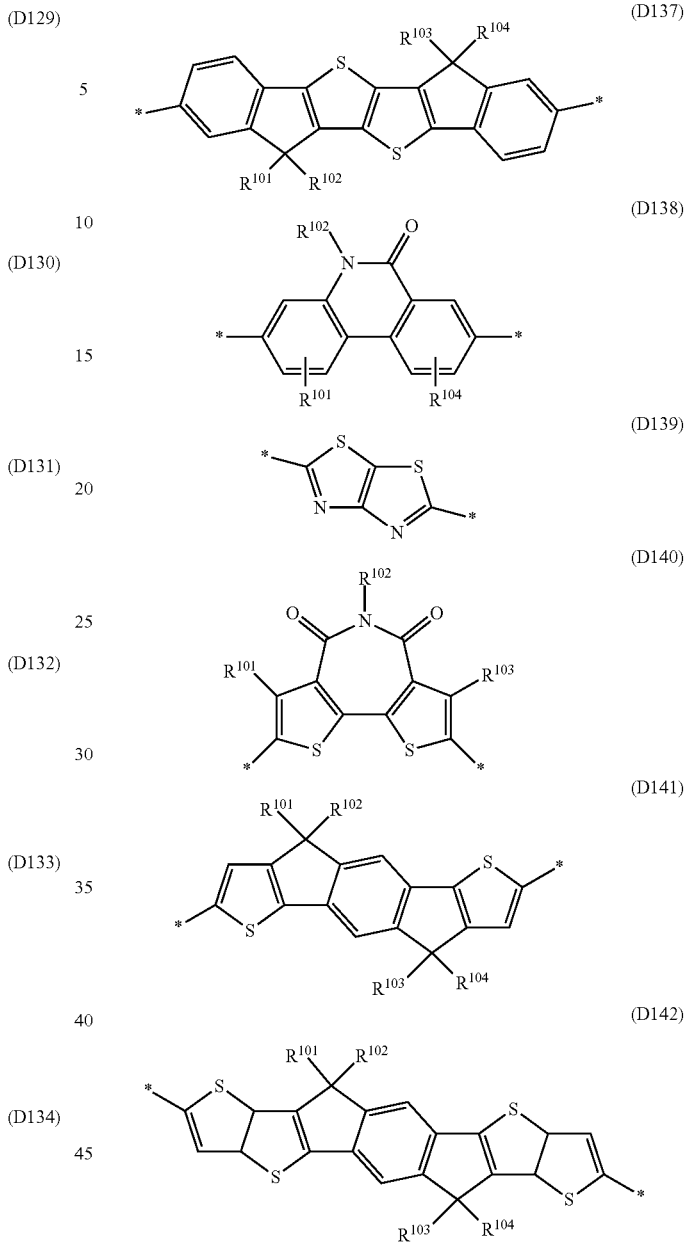

wherein $R^{101}$, $R^{102}$, $R^{103}$, $R^{104}$, $R^{105}$, $R^{106}$, $R^{107}$ and $R^{108}$ are independently of each other selected from the group consisting of H and $R^S$ as defined herein.

$R^S$ is at each occurrence independently a carbyl group as defined herein and preferably selected from the group consisting of any group $R^T$ as defined herein, hydrocarbyl having from 1 to 40 carbon atoms wherein the hydrocarbyl may be further substituted with one or more groups $R^T$, and hydrocarbyl having from 1 to 40 carbon atoms comprising one or more heteroatoms selected from the group consisting of N, O, S, P, Si, Se, As, Te or Ge, with N, O and S being preferred heteroatoms, wherein the hydrocarbyl may be further substituted with one or more groups $R^T$.

Preferred examples of hydrocarbyl suitable as $R^S$ may at each occurrence be independently selected from phenyl, phenyl substituted with one or more groups $R^T$, alkyl and alkyl substituted with one or more groups $R^T$, wherein the alkyl has at least 1, preferably at least 5 and has at most 40, more preferably at most 30 or 25 or 20, even more preferably at most 15 and most preferably at most 12 carbon atoms. It is noted that for example alkyl suitable as $R^S$ also includes fluorinated alkyl, i.e. alkyl wherein one or more hydrogen is replaced by fluorine, and perfluorinated alkyl, i.e. alkyl wherein all of the hydrogen are replaced by fluorine.

$R^T$ is at each occurrence independently selected from the group consisting of F, Br, Cl, —CN, —NC, —NCO, —NCS, —OCN, —SCN, —C(O)NR$^O$R$^{OO}$, —C(O)X$^O$, —C(O)R$^O$, —NH$_2$, —NR$^O$R$^{OO}$, —SH, —SR$^O$, —SO$_3$H, —SO2R$^O$, —OH, —OR$^O$, —NO$_2$, —SF$_5$ and —SiROR$^{OO}$R$^{OOO}$. Preferred $R^T$ are selected from the group consisting of F, Br, Cl, —CN, —NC, —NCO, —NCS, —OCN, —SCN, —C(O)NR$^O$R$^{OO}$, —C(O)X$^O$, —C(O)R$^O$, —NH$_2$, —NR$^O$R$^{OO}$, —SH, —SR$^O$, —OH, —OR$^O$ and —SiROR$^{OO}$R$^{OOO}$. Most preferred $R^T$ is F.

$R^O$, $R^{OO}$ and $R^{OOO}$ are at each occurrence independently of each other selected from the group consisting of H, F and hydrocarbyl having from 1 to 40 carbon atoms. Said hydrocarbyl preferably has at least 5 carbon atoms. Said hydrocarbyl preferably has at most 30, more preferably at most 25 or 20, even more preferably at most 20, and most preferably at most 12 carbon atoms. Preferably, $R^O$, $R^{OO}$ and $R^{OOO}$ are at each occurrence independently of each other selected from the group consisting of H, F, alkyl, fluorinated alkyl, alkenyl, alkynyl, phenyl and fluorinated phenyl. More preferably, $R^O$, $R^{OO}$ and $R^{OOO}$ are at each occurrence independently of each other selected from the group consisting of H, F, alkyl, fluorinated, preferably perfluorinated, alkyl, phenyl and fluorinated, preferably perfluorinated, phenyl.

It is noted that for example alkyl suitable as $R^O$, $R^{OO}$ and $R^{OOO}$ also includes perfluorinated alkyl, i.e. alkyl wherein all of the hydrogen are replaced by fluorine. Examples of suitable alkyls may be selected from the group consisting of methyl, ethyl, n-propyl, iso-propyl, n-butyl, iso-butyl, tert-butyl (or "t-butyl"), pentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl (—C$_{20}$H$_{41}$).

$X^O$ is halogen. Preferably $X^O$ is selected from the group consisting of F, Cl and Br.

A hydrocarbyl group comprising a chain of 3 or more carbon atoms and heteroatoms combined may be straight chain, branched and/or cyclic, including spiro and/or fused rings.

Hydrocarbyl suitable as $R^S$, $R^O$, $R^{OO}$ and/or $R^{OOO}$ may be saturated or unsaturated. Examples of saturated hydrocarbyl include alkyl. Examples of unsaturated hydrocarbyl may be selected from the group consisting of alkenyl (including acyclic and cyclic alkenyl), alkynyl, allyl, alkyldienyl, polyenyl, aryl and heteroaryl.

Preferred hydrocarbyl suitable as $R^S$, $R^O$, $R^{OO}$ and/or $R^{OOO}$ include hydrocarbyl comprising one or more heteroatoms and may for example be selected from the group consisting of alkoxy, alkylcarbonyl, alkoxycarbonyl, alkylcarbonyloxy and alkoxycarbonyloxy, alkylaryloxy, arylcarbonyl, aryloxycarbonyl, arylcarbonyloxy and aryloxycarbonyloxy.

Preferred examples of aryl and heteroaryl comprise mono-, bi-or tricyclic aromatic or heteroaromatic groups that may also comprise condensed rings.

Especially preferred aryl and heteroaryl groups may be selected from the group consisting of phenyl, phenyl wherein one or more CH groups are replaced by N, naphthalene, fluorene, thiophene, pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, thieno[3,2-b]thiophene, thieno[2,3-b]thiophene, dithienothiophene, furo[3,2-b]furan, furo[2,3-b]furan, seleno[3,2-b]selenophene, seleno[2,3-b]selenophene, thieno[3,2-b]selenophene, thieno[2,3-b]furan, indole, isoindole, benzo[b]furan, benzo[b]thiophene, benzo[1,2-b;4,5-b']dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole and benzothiadiazole.

Preferred examples of an alkoxy group, i.e. a corresponding alkyl group wherein the terminal CH$_2$ group is replaced by —O—, can be straight-chain or branched, preferably straight-chain (or linear). Suitable examples of such alkoxy group may be selected from the group consisting of methoxy, ethoxy, propoxy, butoxy, pentoxy, hexoxy, heptoxy, octoxy, nonoxy, decoxy, undecoxy, dodecoxy, tridecoxy, tetradecoxy, pentadecoxy, hexadecoxy, heptadecoxy and octadecoxy.

Preferred examples of alkenyl, i.e. a corresponding alkyl wherein two adjacent CH$_2$ groups are replaced by —CH=CH— can be straight-chain or branched. It is preferably straight-chain. Said alkenyl preferably has 2 to 10 carbon atoms. Preferred examples of alkenyl may be selected from the group consisting of vinyl, prop-1-enyl, or prop-2-enyl, but-1-enyl, but-2-enyl or but-3-enyl, pent-1-enyl, pent-2-enyl, pent-3-enyl or pent-4-enyl, hex-1-enyl, hex-2-enyl, hex-3-enyl, hex-4-enyl or hex-5-enyl, hept-1-enyl, hept-2-enyl, hept-3-enyl, hept-4-enyl, hept-5-enyl or hept-6-enyl, oct-1-enyl, oct-2-enyl, oct-3-enyl, oct-4-enyl, oct-5-enyl, oct-6-enyl or oct-7-enyl, non-1-enyl, non-2-enyl, non-3-enyl, non-4-enyl, non-5-enyl, non-6-enyl, non-7-enyl, non-8-enyl, dec-1-enyl, dec-2-enyl, dec-3-enyl, dec-4-enyl, dec-5-enyl, dec-6-enyl, dec-7-enyl, dec-8-enyl and dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples of particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Alkenyl groups having up to 5 C atoms are generally preferred.

Preferred examples of oxaalkyl, i.e. a corresponding alkyl wherein one non-terminal CH$_2$ group is replaced by —O—, can be straight-chain or branched, preferably straight chain. Specific examples of oxaalkyl may be selected from the group consisting of 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6-or 7-oxaoctyl, 2-, 3-, 4-, 5-, 6-, 7-or 8-oxanonyl and 2-, 3-, 4-, 5-, 6-,7-, 8-or 9-oxadecyl.

Preferred examples of carbonyloxy and oxycarbonyl, i.e. a corresponding alkyl wherein one CH$_2$ group is replaced by —O— and one of the thereto adjacent CH$_2$ groups is replaced by —C(O)—. may be selected from the group consisting of acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxycarbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl, and 4-(methoxycarbonyl)-butyl.

Preferred examples of thioalkyl, i.e where one $CH_2$ group is replaced by —S—, may be straight-chain or branched, preferably straight-chain. Suitable examples may be selected from the group consisting of thiomethyl (—$SCH_3$), 1-thioethyl (—$SCH_2CH_3$), 1-thiopropyl (—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) and 1-(thiododecyl).

A fluoroalkyl group is preferably perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or partially fluorinated alkyl, in particular 1,1-difluoroalkyl, all of which are straight-chain or branched.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-propylpentyl, 2-butyloctyl, 2-hexyldecyl, 2-octyldodecyl, 7-decylnonadecyl, in particular 2-methylbutyl, 2-methylbutoxy, 2-methylpentoxy, 3-methylpentoxy, 2-ethyl-hexoxy, 1-methylhexoxy, 2-octyloxy, 2-oxa-3-methylbutyl, 3-oxa-4-methyl-pentyl, 4-methylhexyl, 2-butyloctyl, 2-hexyldecyl, 2-octyldodecyl, 7-decylnonadecyl, 3,8-dimethyloctyl, 2-hexyl, 2-octyl, 2-nonyl, 2-decyl, 2-dodecyl, 6-meth-oxyoctoxy, 6-methyloctoxy, 6-methyloctanoyloxy, 5-methylheptyloxy-carbonyl, 2-methylbutyryloxy, 3-methylvaleroyloxy, 4-methylhexanoyloxy, 2-chloropropionyloxy, 2-chloro-3-methylbutyryloxy, 2-chloro-4-methyl-valeryl-oxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Most preferred is 2-ethylhexyl.

Preferred achiral branched groups are isopropyl, isobutyl (=methylpropyl), isopentyl (=3-methylbutyl), tert. butyl, isopropoxy, 2-methyl-propoxy and 3-methylbutoxy.

In a preferred embodiment, the organyl groups are independently of each other selected from primary, secondary or tertiary alkyl or alkoxy with 1 to 30 C atoms, wherein one or more H atoms are optionally replaced by F, or aryl, aryloxy, heteroaryl or heteroaryloxy that is optionally alkylated or alkoxylated and has 4 to 30 ring atoms. Very preferred groups of this type are selected from the group consisting of the following formulae

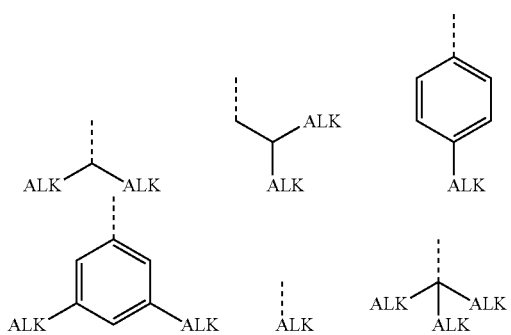

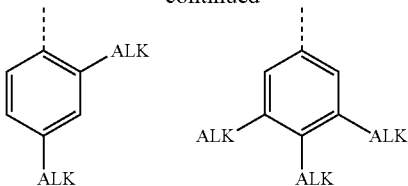

wherein "ALK" denotes optionally fluorinated, preferably linear, alkyl or alkoxy with 1 to 20, preferably 1 to 12 C-atoms, in case of tertiary groups very preferably 1 to 9 C atoms, and the dashed line denotes the link to the ring to which these groups are attached. Especially preferred among these groups are those wherein all ALK subgroups are identical.

Further, in some preferred embodiments in accordance with the present invention, the organic semiconducting materials are polymers or copolymers that encompass one or more repeating units, e.g. M in formula (I), selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl.

Preferred examples of organic semiconducting materials comprise one or more monomeric units selected from the group consisting of formulae (A1) to (A83) and one or more monomeric units selected from the group consisting of formulae (D1) to (D142).

Further preferred examples of organic semiconductor materials that can be used in this invention include compounds, oligomers and derivatives of compounds selected from the group consisting of conjugated hydrocarbon polymers such as polyacene, polyphenylene, poly(phenylene vinylene), polyfluorene including oligomers of those conjugated hydrocarbon polymers; condensed aromatic hydrocarbons, such as, tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo-or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(di-thieno[3,2-b2',3'-d]thiophene); 2,8-dialkyl, substituted dialkyl, diaryl or substituted diaryl anthradithiophene; 2,2'-bisbenzo[1,2-b:4,5-b']dithiophene. Where a liquid deposition technique of the OSC is desired, compounds from the above list and derivatives thereof are limited to those that are soluble in an appropriate solvent or mixture of appropriate solvents.

Other preferred examples of organic semiconducting materials may be selected from the group consisting of substituted oligoacenes, such as pentacene, tetracene or anthracene, or heterocyclic derivatives thereof. Bis(trialkyl-silylethynyl) oligoacenes or bis(trialkylsilylethynyl) het-eroacenes, as disclosed for example in U.S. Pat. No. 6,690,029 or WO 2005/055248 A1 or U.S. Pat. No. 7,385,221, are also useful.

Further preferred organic semiconducting materials are selected from the group consisting of small molecules or monomers of the tetra-heteroaryl indacenodithiophene-based structural unit as disclosed in WO 2016/015804 A1, and polymers or copolymers comprising one or more repeating units thereof.

Also preferred organic semiconducting materials may be selected from the group of small molecules or monomers or polymers comprising a 2,7-(9,9')spirobifluorene moiety, optionally substituted and preferably substituted with amino groups. Such spirobifluorenes are, for example, disclosed in WO 97/39045. Examples of spirobifluorenes suitable for use as monomeric unit M of formula (V) may be selected from the group consisting of formulae (VI-1) to (VI-7)

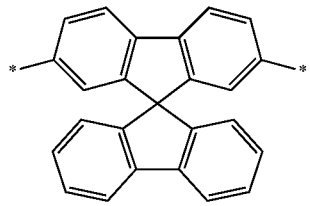
(VI-1)

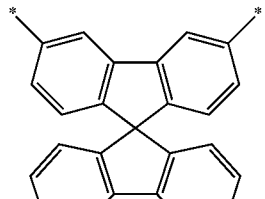
(VI-2)

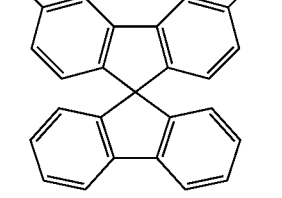
(VI-3)

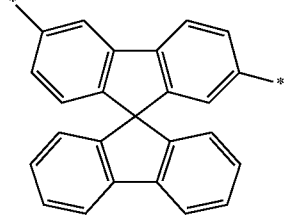
(VI-4)

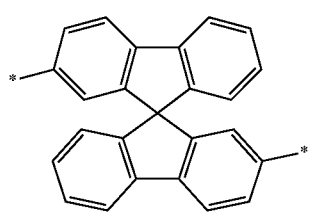

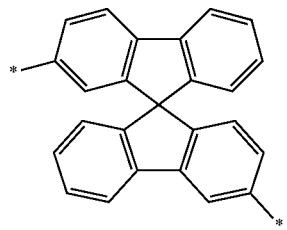
(VI-5)

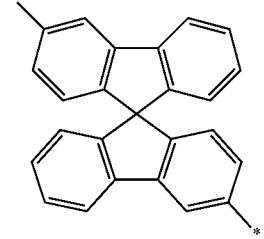
(VI-6)

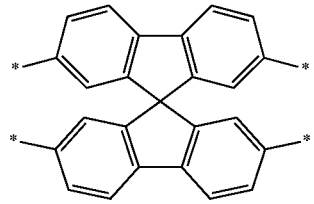
(VI-7)

wherein each of the hydrogen atoms may independently of any other be as defined herein in respect to $R^{101}$ and each asterisk "*" independently may denote a bond to neighboring moiety (for example in a polymer) or may denote a bond to a group as defined above for $R^{101}$ (for example in a compound of formula (V-a) or (V-b)). In respect to formulae (VI-1) to (VI-7) preferred substituents, including the ones for "*" may be selected from the group consisting of alkyl having from 1 to 20 carbon atoms; aryl having from 6 to 20 carbon atoms, said aryl being optionally substituted with alkyl or alkoxy having from 1 to 20, preferably 1 to 10 carbon atoms; and $NR^{110}R^{111}$ with $R^{110}$ and $R^{111}$ being independently of each other selected from the group consisting of alkyl having from 1 to 20 carbon atoms, aryl having from 6 to 20 carbon atoms, said aryl being optionally substituted with alkyl or alkoxy having from 1 to 20, preferably 1 to 10 carbon atoms, most preferably $R^{110}$ and $R^{111}$ being independently of each other selected from methyl, ethyl, n-propyl, iso-propyl, n-butyl, iso-butyl, tert-butyl, pentyl, methoxy, ethoxy, n-propoxy, iso-propoxy n-butoxy, iso-butoxy, tert-butoxy and pentoxy.

In a one aspect the present semiconducting material may, for example, be a small molecule, i.e. a compound comprising one (i.e. m=1) structural unit of formula (V) and two inert chemical groups $R^a$ and $R^b$. Such a small molecule may for example be represented by formula (I-a)

$$R^a—M—R^b \qquad (V\text{-}a)$$

wherein M is as defined herein and $R^a$ and $R^b$ are inert chemical groups. Such inert chemical groups $R^a$ and $R^b$ may independently of each other be selected from the group consisting of hydrogen, fluorine, alkyl having from 1 to 10 carbon atoms, alkyl having from 1 to 10 carbon atoms wherein one or more, for example all, hydrogen has been replaced with fluorine, aromatic ring systems of from 5 to 30 carbon atoms and aromatic ring systems of from 5 to 30 carbon atoms wherein one or more hydrogen atom may independently of any other be replaced by fluorine or alkyl having from 1 to 10 carbon atoms.

Further preferred p-type OSCs are copolymers comprising electron acceptor and electron donor units. Preferred copolymers of this preferred embodiment are for example copolymers comprising one or more benzo[1,2-b:4,5-b']dithiophene-2,5-diyl units that are preferably 4,8-disubstituted by one or more groups R as defined above, and further comprising one or more aryl or heteroaryl units selected from Group A and Group B, preferably comprising at least one unit of Group A and at least one unit of Group B, wherein Group A consists of aryl or heteroaryl groups having electron donor properties and Group B consists of aryl or heteroaryl groups having electron acceptor properties, and preferably:

Group A consists of selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2-dithiophene, 2,2-diselenophene, dithieno[3,2-b:2',3'-d]silole-5,5-diyl, 4H-cyclopenta[2,1-b:3,4-b']dithiophene-2,6-diyl, 2,7-di-thien-2-yl-carbazole, 2,7-di-thien-2-yl-fluorene, indaceno[1,2-b:5,6-b']dithiophene-2,7-diyl, benzo[1'',2'':4,5;4'',5'':4',5']bis(silolo[3,2-b:3',2'-b']thiophene)-2,7-diyl, 2,7-di-thien-2-yl-indaceno [1,2-b:5,6-b']dithiophene, 2,7-di-thien-2-yl-benzo[1'',2'':4,5;4'',5'':4',5']bis(silolo[3,2-b:3',2'-b']thiophene)-2,7-diyl, and 2,7-di-thien-2-yl-phenanthro[1,10,9,8-c,d,e,f,g]carbazole, all of which are optionally substituted by one or more, preferably one or two groups R as defined above, and;

Group B consists of benzo[2,1,3]thiadiazole-4,7-diyl, 5,6-dialkyl-benzo[2,1,3]thiadiazole-4,7-diyl, 5,6-dialkoxybenzo[2,1,3]thiadiazole-4,7-diyl, benzo[2,1,3]selenadiazole-4,7-diyl, 5,6-dialkoxy-benzo[2,1,3]selenadiazole-4,7-diyl, benzo[1,2,5]thiadiazole-4,7,diyl, benzo[1,2,5]selenadiazole-4,7,diyl, benzo[2,1,3]oxadiazole-4,7-diyl, 5,6-dialkoxy-benzo[2,1,3]oxadiazole-4,7-diyl, 2H-benzotriazole-4,7-diyl, 2,3-dicyano-1,4-phenylene, 2,5-dicyano,1,4-phenylene, 2,3-difluro-1,4-phenylene, 2,5-difluoro-1,4-phenylene, 2,3,5,6-tetrafluoro-1,4-phenylene, 3,4-difluorothiophene-2,5-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, and 3,6-pyrrolo[3,4-c]pyrrole-1,4-dione, all of which are optionally substituted by one or more, preferably one or two groups R as defined above.

In other preferred embodiments of the present invention, the OSC materials are substituted oligoacenes such as pentacene, tetracene or anthracene, or heterocyclic derivatives thereof. Bis(trialkylsilylethynyl) oligoacenes or bis(trialkylsilylethynyl) heteroacenes, as disclosed for example in U.S. Pat. No. 6,690,029 or WO 2005/055248 A1 or U.S. Pat. No. 7,385,221, are also useful.

Further preferred organic semiconducting materials are selected from the group consisting of small molecules or monomers of the tetra-heteroaryl indacenodithiophene-based structural unit as disclosed in WO 2016/015804 A1, and polymers or copolymers comprising one or more repeating units thereof, such as, for example, one of the following polymers (P-1) to (P-3):

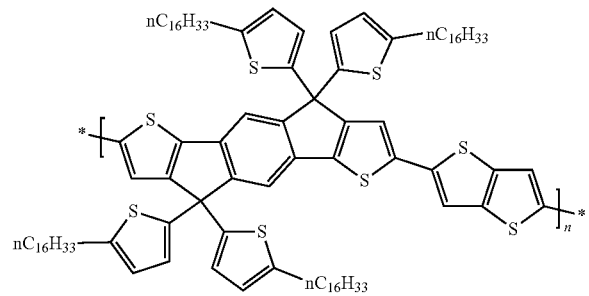

(P-1)

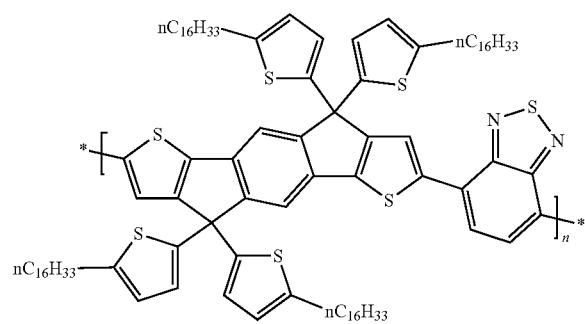

(P-2)

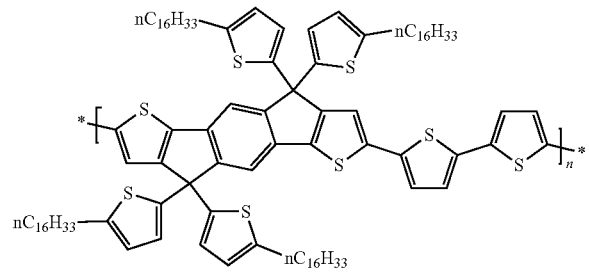

(P-3)

Depending upon the intended application the present organic semiconducting material may also comprise other components, such as, for example, a fullerene or modified fullerene. In such blends of polymer and fullerene the ratio polymer:fullerene is preferably from 5:1 to 1:5 by weight, more preferably from 1:1 to 1:3 by weight, most preferably 1:1 to 1:2 by weight. Suitable fullerenes may, for example, be indene-$C_{60}$-fullerene bis-adduct like ICBA, or a (6,6)-phenyl-butyric acid methyl ester derivatized methano $C_{60}$ fullerene, also known as "PCBM-$C_{60}$" or "$C_{60}$PCBM", as disclosed for example in G. Yu, J. Gao, J. C. Hummelen, F. Wudl, A. J. Heeger, Science 1995, Vol. 270, p. 1789 ff and having the structure shown below, or structural analogous compounds with e.g. a $C_{61}$ fullerene group, a $C_{70}$ fullerene group, or a $C_{71}$ fullerene group, or an organic polymer (see for example Coakley, K. M. and McGehee, M. D. Chem. Mater. 2004, 16, 4533).

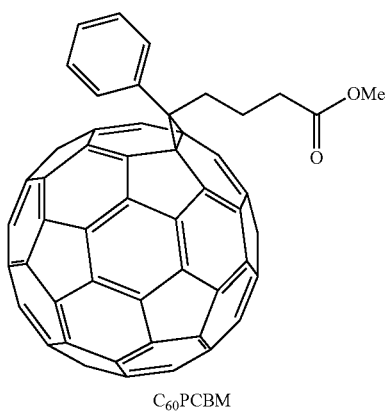 [SMILES: COC(=O)CCCC1(c2ccccc2)C23C=C4Cc5cc6cc7c8c9c(cc%10cc%11c%12c(c%13c%14c%15c(c4c5c4c6c8c(c%154)c4c9c%10c%12c%144)C%1321)C(=C3)C%11)C7]

C$_{60}$PCBM

Organic semiconducting materials may be purchased from commercial sources, such as SigmaAldrich or Merck KGAA (Darmstadt, Germany), or may be synthesized according to published syntheses.

In a further aspect the present semiconducting material may be an oligomer or a polymer as defined above. Such oligomers and polymers may be synthesized according to or in analogy to methods that are known to the skilled person and are described in the literature from monomers as described in the following.

Monomers that are suitable for the synthesis of the present oligomers and polymers may be selected from compounds comprising a structural unit of formula (I) and at least one reactive chemical group Re which may be selected from the group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^3$)$_2$, —C≡CH, —C≡CSi(Z$^1$)$_3$, —ZnX$^{00}$ and —Sn(Z$^4$)$_3$, preferably —B(OZ$^2$)$_2$ or —Sn(Z$^4$)$_3$, wherein X$^{00}$ is as defined herein, and Z$^1$, Z$^2$, Z$^3$ and Z$^4$ are selected from the group consisting of alkyl and aryl, preferably alkyl having from 1 to 10 carbon atoms, each being optionally substituted with R$^0$ as defined herein, and two groups Z$^2$ may also together form a cyclic group. Alternatively such a monomer may comprise two reactive chemical groups and is, for example, represented by formula (V-b)

$$R^c—M—R^d \quad \text{(V-b)}$$

wherein M is as defined herein and R$^c$ and R$^d$ are reactive chemical groups as defined above in respect to R$^c$. Such monomers may generally be prepared according to methods well known to the person skilled in the art.

X$^{00}$ is halogen. Preferably X$^{00}$ is selected from the group consisting of F, Cl and Br. Most preferably X$^{00}$ is Br.

Preferred aryl-aryl coupling and polymerisation methods used in the processes described herein may, for example, be one or more of Yamamoto coupling, Kumada coupling, Negishi coupling, Suzuki coupling, Stille coupling, Sonogashira coupling, Heck coupling, C—H activation coupling, Ullmann coupling and Buchwald coupling. Especially preferred are Suzuki coupling, Negishi coupling, Stille coupling and Yamamoto coupling. Suzuki coupling is described for example in WO 00/53656 A1. Negishi coupling is described for example in *J. Chem. Soc., Chem. Commun.*, 1977, 683-684. Yamamoto coupling is described for example in T. Yamamoto et al., *Prog. Polym. Sci.*, 1993, 17, 1153-1205, or WO 2004/022626 A1, and Stille coupling is described for example in Z. Bao et al., *J. Am. Chem. Soc.*, 1995, 117, 12426-12435. For example, when using Yamamoto coupling, monomers having two reactive halide groups are preferably used. When using Suzuki coupling, compounds of formula (I-b) having two reactive boronic acid or boronic acid ester groups or two reactive halide groups are preferably used. When using Stille coupling, monomers having two reactive stannane groups or two reactive halide groups are preferably used. When using Negishi coupling, monomers having two reactive organozinc groups or two reactive halide groups are preferably used.

Preferred catalysts, especially for Suzuki, Negishi or Stille coupling, are selected from Pd(0) complexes or Pd(II) salts. Preferred Pd(0) complexes are those bearing at least one phosphine ligand, for example Pd(Ph$_3$P)$_4$. Another preferred phosphine ligand is tris(ortho-tolyl)phosphine, for example Pd(o-Tol$_3$P)$_4$. Preferred Pd(II) salts include palladium acetate, for example Pd(OAc)$_2$. Alternatively the Pd(0) complex can be prepared by mixing a Pd(0) dibenzylideneacetone complex, for example tris(dibenzyl-ideneacetone) dipalladium(0), bis(dibenzylideneacetone)-palladium(0), or Pd(II) salts e.g. palladium acetate, with a phosphine ligand, for example triphenylphosphine, tris(ortho-tolyl)phosphine or tri(tert-butyl)phosphine. Suzuki polymerisation is performed in the presence of a base, for example sodium carbonate, potassium carbonate, lithium hydroxide, potassium phosphate or an organic base such as tetraethylammonium carbonate or tetraethylammonium hydroxide. Yamamoto polymerisation employs a Ni(0) complex, for example bis(1,5-cyclooctadienyl)nickel(0).

Suzuki and Stille polymerisation may be used to prepare homopolymers as well as statistical, alternating and block random copolymers. Statistical or block copolymers can be prepared for example from the above monomers of formula (I-b), wherein one of the reactive groups is halogen and the other reactive group is a boronic acid, boronic acid derivative group or and alkylstannane. The synthesis of statistical, alternating and block copolymers is described in detail for example in WO 03/048225 A2 or WO 2005/014688 A2.

As alternatives to halogens as described above, leaving groups of formula —O—SO$_2$Z$^1$ can be used wherein Z1 is as described above. Particular examples of such leaving groups are tosylate, mesylate and triflate.

Where appropriate and needed, for example, to modify the rheological properties as is described for example in WO 2005/055248 A1, some embodiments of the present invention employ organic semiconducting compositions that include one or more organic binders.

The binder, which is typically a polymer, may comprise either an insulating binder or a semiconducting binder, or mixtures thereof, may be referred to herein as the organic binder, the polymeric binder, or simply the binder.

Preferred binders according to the present invention are materials of low permittivity, that is, those having a permittivity ε of 3.3 or less. The organic binder preferably has a permittivity & of 3.0 or less, more preferably 2.9 or less. Preferably the organic binder has a permittivity ε of 1.7 or more. It is especially preferred that the permittivity of the binder is in the range from 2.0 to 2.9. Whilst not wishing to be bound by any particular theory it is believed that the use of binders with a permittivity of greater than 3.3, may lead to a reduction in the OSC layer mobility in an electronic device, for example, in an OFET. In addition, high permittivity binders could also result in increased current hysteresis of the device, which is undesirable.

Examples of suitable organic binders include polystyrene, or polymers or copolymers of styrene and a-methyl styrene; or copolymers including styrene, a-methylstyrene and butadiene may suitably be used. Further examples of suitable binders are disclosed for example in US 2007/0102696 A1.

In one type of preferred embodiment, the organic binder is one in which at least 95%, more preferably at least 98% and especially all of the atoms consist of hydrogen, fluorine and carbon atoms.

The binder is preferably capable of forming a film, more preferably a flexible film.

The binder can also be selected from crosslinkable binders such as acrylates, epoxies, vinylethers, and thiolenes, preferably having a sufficiently low permittivity, very preferably of 3.3 or less. The binder can also be mesogenic or liquid crystalline.

In another preferred embodiment the binder is a semiconducting binder, which contains conjugated bonds, especially conjugated double bonds and/or aromatic rings. Suitable and preferred binders are for example polytriarylamines as disclosed for example in U.S. Pat. No. 6,630,566.

The proportions of binder to OSC is typically 20:1 to 1:20 by weight, preferably 10:1 to 1:10 more preferably 5:1 to 1:5, still more preferably 3:1 to 1:3 further preferably 2:1 to 1:2 and especially 1:1. Dilution of the compound of formula (V) in the binder has been found to have little or no detrimental effect on the charge mobility, in contrast to what would have been expected from the prior art.

The present organic electronic device may optionally comprise one or more substrates. Such substrate is not particularly limited and may be any suitable material that is inert under use conditions. Examples of such materials are glass and polymeric materials. Preferred polymeric material include but are not limited to alkyd resins, allyl esters, benzocyclobutenes, butadiene-styrene, cellulose, cellulose acetate, epoxide, epoxy polymers, ethylene-chlorotrifluoro ethylene copolymers, ethylene-tetra-fluoroethylene copolymers, fiber glass enhanced polymers, fluorocarbon polymers, hexafluoropropylenevinylidene-fluoride copolymer, high density polyethylene, parylene, polyamide, polyimide, polyaramid, polydimethylsiloxane, polyethersulphone, polyethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, polycycloolefin, silicone rubbers, and silicones. Of these polyethyleneterephthalate, polyimide, polycycloolefin and polyethylenenaphthalate materials are more preferred. Additionally, for some embodiments of the present invention the substrate can be any suitable material, for example a polymeric material, metal or glass material coated with one or more of the above listed materials or coated with one or more metal, such as for example titanium. It will be understood that in forming such a substrate, methods such as extruding, stretching, rubbing or photochemical techniques can be employed to provide a homogeneous surface for device fabrication as well as to provide pre-alignment of an organic semiconductor material in order to enhance carrier mobility therein. Alternatively, the substrate can be a polymeric material, metal or glass coated with one or more of the above polymeric materials.

A suitable substrate may, for example, be transparent or semi-transparent. A suitable substrate may, for example, also be flexible or non-flexible.

Said substrate may, for example, serve as support and preferably be adjacent to a first electrode layer. Said substrate may, for example, also serve as support for the planarization layer holding the first electrode layer. In general, a substrate may be introduced into the electronic device between or adjacent to any layer and placed such that it serves best to support the device and/or be best placed with regards to manufacturing requirements.

Additionally the present organic electronic device may optionally comprise further layers acting as charge transport layers. Exemplary charge transport layers may act as hole transporting layer and/or electron blocking layer, or electron transporting layer and/or hole blocking layer. Generally—if present—such layers are between the electrodes and the organic semiconducting layer.

Suitable materials for a hole transporting and/or electron blocking layer may be selected from the group consisting of metal oxides, like for example, zinc tin oxide (ZTO), MoOx, NiOx, a conjugated polymer electrolyte, like for example PEDOT:PSS, a conjugated polymer, like for example polytriarylamine (PTAA), an organic compound, like for example N,N'-diphenyl-N,N'-bis(1-naphthyl)(1,1'-biphenyl)-4,4'diamine (NPB), N,N'-diphenyl-N,N'-(3-methylphenyl)-1,1'-biphenyl-4,4'-diamine (TPD).

Suitable materials for a hole blocking and/or electron transporting layer may be selected from the group consisting of metal oxides, such as for example, ZnOx, TiOx, a salt, like for example LiF, NaF, CsF, a conjugated polymer electrolyte, like for example poly[3-(6-trimethylammoniumhexyl)thiophene], poly(9,9-bis(2-ethylhexyl)-fluorene]-b-poly[3-(6-trimethylammoniumhexyl)thiophene], or poly [(9,9-bis(3'-(N,N-dimethyl-amino)propyl)-2,7-fluorene)-alt-2,7-(9,9-dioctyl-fluorene)] or an organic compound, like for example tris(8-quinolinolato)-aluminium(III) (Alq$_3$), 4,7-diphenyl-1,10-phenanthroline.

The present organic electronic device may, for example, be selected from the group consisting of organic field effect transistors (OFET), organic thin film transistors (OTFT), organic light emitting diodes (OLED), organic light emitting transistors (OLET), organic photovoltaic devices (OPV), organic photodetectors (OPD), organic solar cells, laser diodes, Schottky diodes, photoconductors and photodetectors. Preferably the present organic electronic device is an organic field effect transistor (PFET) or an organic thin film transistor (OTFT).

A preferred example of the present organic electronic device is an organic field effect transistor, preferably comprising a gate electrode, a source electrode, a drain electrode, an insulating layer (preferably a gate insulating layer), and an organic semiconducting layer. Optionally an organic field effect transistor may also comprise one or more selected from the group consisting of substrate and charge transport layer. These layers in the OFET device may be arranged in any sequence, provided that the source electrode and the drain electrode are separated from the gate electrode by the insulating layer, the gate electrode and the semiconductor layer both contact the insulating layer, and the source electrode and the drain electrode both contact the semiconducting layer with the surface treatment layer in-between.

The OFET device according to the present invention can be a top gate device or a bottom gate device. Suitable structures of an OFET device are known to the skilled person and are described in the literature, for example in US 2007/0102696 A1.

FIG. 1 shows a schematic representation of a typical top gate OFET according to the present invention, including source (S) and drain (D) electrodes (2) provided on a substrate (1), a self-assembled monolayer (3) formed by depositing a compound of formula (I) as defined herein provided on the S/D electrodes, a layer of organic semiconducting material (4) provided on the S/D electrodes and the self-assembled monolayer (3), a layer of dielectric material (5) as gate insulator layer provided on the organic semiconducting layer (4), a gate electrode (6) provided on the gate insulator layer (5), and an optional passivation or protection layer (7) provided on the gate electrode (6) to shield it from further layers or devices that may be provided later or to protect it from environmental influence. The area between the source and drain electrodes (2), indicated by the double arrow, is the channel area.

Figure 2:
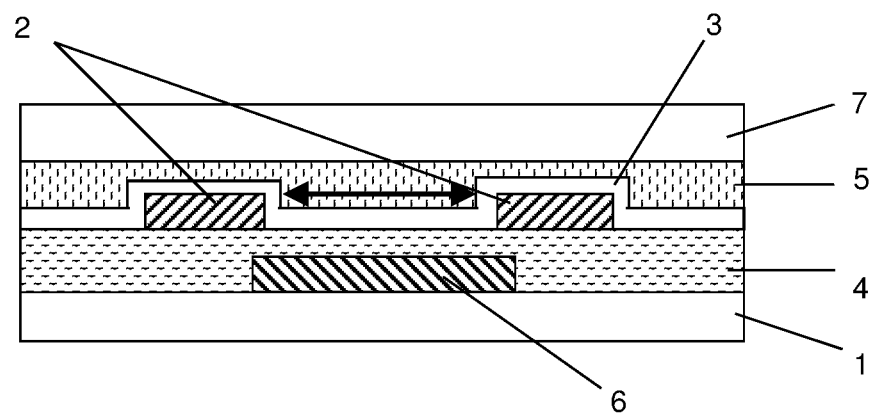
FIG. 2 shows a schematic representation of an exemplary bottom gate OFET in accordance with the present application.

FIG. 2 shows a schematic representation of a typical bottom gate-bottom contact OFET according to the present invention, including a gate electrode (6) provided on a substrate (1), a layer of dielectric material (5) (gate insulator layer) provided on the gate electrode (4), source (S) and drain (D) electrodes (2) provided on the gate insulator layer (6), a self-assembled monolayer (3) formed by depositing a compound of formula (I) as defined herein provided on the S/D electrodes, a layer of an organic semiconducting material (4) provided on the S/D electrodes and the self-assembled monolayer (3), and an optional protection or passivation layer (7) provided on the organic semiconducting layer (4) to shield it from further layers or devices that may be later provided or protect it from environmental influences.

In an OFET device according to the present invention, the dielectric material for the gate insulator layer is preferably a solution processable material . For the dielectric that is in direct contact with the semiconductor. Especially preferred are organic dielectric materials having a dielectric constant from 1.0 to 5.0, very preferably from 1.8 to 4.0 ("low k materials"), as disclosed for example in US 2007/0102696 A1 or U.S. Pat. No. 7,095,044. For an optional second dielectric layer the dielectric constant is not restricted, but preferably is fairly high in order to increase the device's capacitance.

Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377). Especially preferred are organic dielectric materials having a dielectric constant from 1.0 to 5.0, very preferably from 1.8 to 4.0 ("low k materials"), as disclosed for example in US 2007/0102696 A1 or U.S. Pat. No. 7,095,044.

The present transistor device may also be a complementary organic thin film transistor (CTFT) comprising a layer of a p-type semiconductor material as well as a layer of an n-type semiconductor material.

In general terms, the present application also relates to a method for producing the present organic electronic device as described above, said method comprising the steps of
(a) providing an electrode as defined herein, optionally on a substrate as defined herein;
(b) depositing onto said electrode a formulation comprising the compound of formula (I) as defined herein and an alcohol of formula $R^2$—OH as defined herein to obtain the self-assembled monolayer; and
(c) depositing onto said self-assembled monolayer an organic semiconducting material to obtain an organic semiconducting layer.

In step (b), the formulation may, for example, be deposited onto the electrode by vacuum or vapor deposition methods or by liquid coating methods. Exemplary deposition methods include physical vapor deposition (PVD), chemical vapor deposition (CVD), sublimation or liquid coating methods. Liquid coating methods are preferred. Particularly preferred are solvent-based liquid coating methods.

In solvent-based liquid coating a formulation, which comprises the compound of formula (I) as defined herein and an alcohol of formula $R^2$—OH as defined herein (or the respective reaction product(s) of the compound of formula (I) as defined herein and an alcohol of formula $R^2$—OH as defined herein), is deposited onto the metal surface or the metal oxide surface. Optionally, following deposition the solvent may be at least partially evaporated. Preferred solvent-based liquid coating methods include, without limitation, dip coating, spin coating, ink jet printing, letter-press printing, screen printing, doctor blade coating, roller printing, reverse-roller printing, offset lithography printing, flexographic printing, gravure printing, web printing, spray coating, brush coating and pad printing.

In addition to the alcohol of formula $R^2$—OH as defined herein, the formulation may comprise one or more further suitable solvent. Such suitable solvents may, for example, be selected from the group consisting of alcohols different from $R^2$—OH as defined herein, ethers, ketones, aromatic hydrocarbons and any mixture of any of these. Suitable ethers may have a linear or a cyclic structure and may for example be selected from the group consisting of diethylether, tetrahydrofuran (THF), butyl phenyl ether, methyl ethyl ether and 4-methylanisole. Suitable ketones may for example be selected from the group consisting of acetone, 2-heptanone and cyclohexanone. Suitable aromatic hydrocarbons may for example be selected from the group consisting of toluene, mesitylene, o-xylene, m-xylene, p-xylene, cyclohexylbenzene and halogenated aromatic hydrocarbons. Examples of such halogenated aromatic hydrocarbons are chlorobenzene, dichlorobenzene and trichlorobenzene as well as any mixture of any of these.

Preferably the compound of formula (I) is present in (or expressed differently, is initially added to) the formulation or solution in from 0.01 wt % to 10 wt %, preferably from 0.01 wt % to 5 wt %, and most preferably from 0.05 wt % to 2 wt %, with wt % being relative to the total weight of the formulation or solution.

The metal or metal oxide may be applied to the substrate by any of the conventional methods. The methods may for example be selected from vacuum deposition, vapor deposition and liquid coating. Exemplary deposition methods include physical vapor deposition (PVD), chemical vapor deposition (CVD), sublimation or liquid coating methods. Such methods form part of the general knowledge in the field and are well known to the skilled person.

Before the SAM treatment, i.e. the formation of the self-assembled monolayer, the metal or metal oxide surface is preferably subjected to a washing step. A preferred washing step comprises an acidic washing with a acid or a blend of acids, said acids being organic or inorganic acids. Examples of suitable acids are acetic acid, citric acid or hydrochloric acid. Alternatively the metal or metal oxide surface may be subjected to a plasma treatment step.

In a preferred embodiment, the washing step and the SAM treatment are combined into a single step. For example, this combined step may be carried out by applying a formulation in accordance with the present invention to the metal or metal oxide surface, said formulation comprising a precursor compound as defined above and an acid as defined above.

Alternatively the washing step and the SAM treatment may be carried out sequentially in two separate steps.

The soaking time, i.e. the time during which the formulation is applied to the metal or metal oxide surface, is preferably at least 5 s and at most 72 h.

In the preparation of the other layers of the electronic devices, preferably the organic electronic devices, of the present invention standard methods may be used to deposit the various layers and materials as described above.

Preferably the deposition of individual functional layers in the preparation of the present electronic devices, such as for example the organic semiconducting layer or the insulator layer, is carried out using solution processing techniques. This can be done for example by applying a formulation, preferably a solution, comprising the organic semiconducting material or the dielectric material and further comprising one or more organic solvents, onto the previously deposited layer, followed by evaporation of the solvent(s). Preferred deposition techniques include, without limitation, dip coating, spin coating, ink jet printing, letterpress printing, screen printing, doctor blade coating, roller printing, reverse-roller printing, offset lithography printing, flexographic printing, web printing, spray coating, brush coating, or pad printing. Very preferred solution deposition techniques are spin coating, flexographic printing and inkjet printing.

In an OFET device according to the present invention, the dielectric material for the gate insulator layer is preferably an organic material. It is preferred that the dielectric layer is solution coated which allows ambient processing, but could also be deposited by various vacuum deposition techniques. When the dielectric is being patterned, it may perform the function of interlayer insulation or act as gate insulator for an OFET. Preferred deposition techniques include, without limitation, dip coating, spin coating, ink jet printing, letterpress printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared. Optionally, the dielectric material could be cross-linked or cured to achieve better resistance to solvents and/or structural integrity and/or to improve patterning (photolithography). Preferred gate insulators are those that provide a low permittivity interface to the organic semiconductor.

Suitable solvents are selected from solvents including but not limited to hydrocarbon solvents, aromatic solvents, cycloaliphatic cyclic ethers, cyclic ethers, acetates, esters, lactones, ketones, amides, cyclic carbonates or multi-component mixtures of the above. Examples of preferred solvents include cyclohexanone, mesitylene, xylene, 2-heptanone, toluene, tetrahydrofuran, MEK (methyl ethyl ketone), MAK (2-heptanone), cyclohexanone, 4-methylanisole, butyl-phenyl ether and cyclohexylbenzene, very preferably MAK, butyl phenyl ether or cyclohexylbenzene.

The total concentration of the respective functional material (organic semiconducting material or gate dielectric material) in the formulation is preferably from 0.1 to 30 wt %, preferably from 0.1 to 5 wt %, relative to the total weight of the formulation (i.e. functional material(s) and solvent (s)). In particular organic ketone solvents with a high boiling point are advantageous for use in solutions for inkjet and flexographic printing.

When spin coating is used as deposition method, the OSC or dielectric material is spun for example between 1000 and 2000 rpm for a period of for example 30 seconds to give a layer with a preferred layer thickness between about 100 nm and about 2000 nm for the dielectric and about 5 nm to about 300 nm for the semiconductor. After spin coating, the film can be heated at an elevated temperature to remove all residual volatile solvents.

Optionally the dielectric material layer is annealed after exposure to radiation, for example at a temperature from 70° C. to 130° C., for example for a period of from 1 to 30 minutes, preferably from 1 to 10 minutes. The annealing step at elevated temperature can be used to complete the cross-linking reaction that was induced by the exposure of the cross-linkable groups of the dielectric material to photoradiation.

All process steps described above and below can be carried out using known techniques and standard equipment which are described in prior art and are well-known to the skilled person. For example, in the photoirradiation step a commercially available UV lamp and photomask can be used, and the annealing step can be carried out in an oven or on a hot plate.

Following the deposition of the self-assembled monolayer, preferably a washing step or a drying step or both are performed.

For the organic electronic device being a top gate OFET, following step (c), said process may additionally comprise the following steps, preferably in such sequence, of
(d) depositing as gate insulator layer a dielectric material as defined herein onto the organic semiconducting layer;
(e) depositing a gate electrode onto the gate insulator layer; and
(f) optionally depositing a passivation layer onto the gate electrode.

For the organic electronic device being a bottom gate OFET, before step (a), the process may further comprise the steps of
(o) depositing a gate electrode onto a substrate; and
(o') depositing as gate insulator layer a dielectric material onto the gate electrode.

Optionally, following step (d), the process may further comprise the step of
(d) depositing a passivation layer onto the organic semiconducting layer.

Further layers may be deposited by standard methods, which are well known in the industry. Liquid coating of devices is more desirable than vacuum deposition techniques. Solution deposition methods are especially preferred. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing.

Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377).

EXAMPLES

The advantages of the present application are illustrated by the following non-limiting examples.

If not otherwise mentioned all solvents, salts, organic semiconducting materials etc. were obtained from commercial sources, such as for example SigmaAldrich or Merck KGaA, Darmstadt, Germany.

It is noted that $F_5C_6$—$SiCl_3$ is sensitive to hydrolysis and therefore is best stored in an environment free of humidity or residual water in solvents.

The electrical characterization of the transistor devices was carried out in ambient air atmosphere using computer controlled Agilent 4155C Semiconductor Parameter Analyser. Charge carrier mobility in the saturation regime ($\mu_{sat}$) was calculated for the compound. Field-effect mobility was calculated in the saturation regime ($V_d > (V_g - V_0)$) using equation (eq. 1):

$$\left(\frac{dI_d^{sat}}{dV_g}\right)_{V_d} = \frac{WC_i}{L}\mu^{sat}(V_g - V_0) \quad (eq. 1)$$

where W is the channel width, L the channel length, $C_i$ the capacitance of insulating layer, $V_g$ the gate voltage, $V_0$ the turn-on voltage, and $\mu_{sat}$ is the charge carrier mobility in the saturation regime. Turn-on voltage ($V_0$) was determined as the onset of source-drain current.

Example 1—Work Function Measurement

Work functions were determined using a Kelvin Probe for electrodes with and without self-assembled monolayer (SAM), wherein the self-assembled monolayer was prepared by immersing the respective electrodes on a glass substrate into a solution of $F_5C_6$—$SiCl_3$ in iso-propanol ($^iPr$—OH), such solution thus-without wishing to be bound by theory-probably predominantly comprising $F_5C_6$—$Si(O-^iPr)_3$ as active species. The respective results are indicated in Table 1.

TABLE 1

| Sample | Work function [eV] |
|---|---|
| ITO without SAM | 4.8 |
| Molybdenum without SAM | 4.9 |
| ITO with SAM | 5.4-5.6 (estimated) |
| Molybdenum with SAM | 5.5-5.7 |

Example 2—Device Preparation

Indium tin oxide (ITO) electrodes on glass were placed in a spin coater and brought for one minute into contact with a solution of $F_5C_6$—$SiCl_3$ in iso-propanol (iPr—OH), such solution thus—without wishing to be bound by theory—probably predominantly comprising $F_5C_6$—$Si(O-^iPr)_3$ as active species, thereby forming the self-assembled monolayer. Excess solution was spun off, following by rinsing with iso-propanol. Onto the resulting self-assembled monolayer was then deposited a layer of an organic semiconducting material comprising derivatives of indacenodithiophene and benzothiadiazole.

Respective mobilities are indicated in Table 2 below.

Example 3—Device Preparation (Comparative)

The preparation of Example 2 was repeated with the difference that for the preparation of the self-assembled monolayer para-chlorobenzene phosphate (see formula (III) below) in iso-propanol, instead of the $F_5C_6$—$SiCl_3$ in iso-propanol, was used.

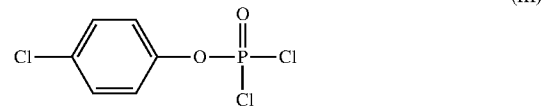

(III)

Respective mobilities are indicated in Table 2 below.

TABLE 2

| | Linear mobility [cm$^2$V$^{-1}$s$^{-1}$] | Saturated mobility [cm$^2$V$^{-1}$s$^{-1}$] | On off ratio |
|---|---|---|---|
| Example 2 | 1.06 | 1.72 | 10$^6$ |
| Example 3 (comp.) | 0.38 | 0.54 | 10$^6$ |

What is claimed is:

1. A method of producing an organic electronic device comprising an electrode, a self-assembled monolayer on said electrode and an organic semiconducting layer on said self-assembled monolayer, said method comprising the steps of (a) providing said electrode;

(b) depositing onto said electrode a formulation comprising a compound of formula (I)

$$R^1—SiX_3 \quad (1)$$

and an alcohol of formula $R^2$—OH, with $R^1$ being a group of the following formula (II-b)

(II-b)

wherein e is at each occurrence independently an integer of at least 1 and of at most 5, and $R^A$ is F, $R^2$ being an alkyl group having from 1 to 10 carbon atoms; and X being Cl, to obtain said self-assembled monolayer; and (c) depositing onto said self-assembled monolayer an organic semiconducting material to obtain said organic semiconducting layer.

2. The method according to claim 1, wherein the self-assembled monolayer is formed by depositing the formulation comprising the compound of formula (I) and the alcohol of formula $R^2$—OH onto the electrode.

3. The method according to claim 1, wherein e is 5.

4. The method according to claim 1, wherein the compound of formula (I) is selected from the group consisting of the following formulae (I-1) to (I-6)

(I-1) 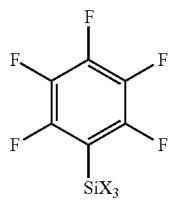

(I-2) 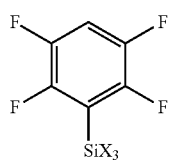

(I-3) 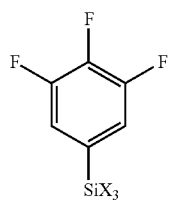

(I-4) 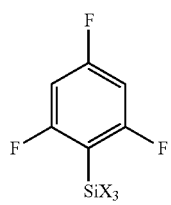

(I-5) 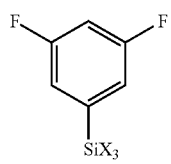

-continued (I-6) 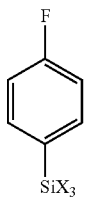

wherein X is Cl.

5. The method according to claim 1, characterized in that the electrode comprises a metal or an electrically conductive metal oxide or a blend thereof.

6. The method according to claim 1, characterized in that the electrode comprises a metal selected from the group consisting of chromium, molybdenum, tungsten, cobalt, rhodium, iridium, nickel, palladium, platinum, gold, silver, and any blend of any of these.

7. The method according to claim 1, characterized in that the electrode comprises a metal selected from the group consisting of chromium, molybdenum and tungsten.

8. The method according to claim 1, characterized in that the electrode comprises an electrically conductive metal oxide selected from the group consisting of indium tin oxide (ITO), molybdenum oxide, tin oxide, and any blend of any of these.

9. The method according to claim 1, wherein the electrode is an indium tin oxide electrode.

10. The method according to claim 1, wherein $R^2$ is an alkyl having from 1 to 5 carbon atoms.

11. The method according to claim 1, wherein said organic electronic device is selected from the group consisting of organic field effect transistors (OFET), organic thin film transistors (OTFT), organic light emitting diodes (OLED), organic light emitting transistors (OLET), organic photovoltaic devices (OPV), organic photodetectors (OPD), organic solar cells, laser diodes, Schottky diodes, photoconductors and photodetectors.

12. The method according to claim 1, wherein said organic electronic device is an organic field effect transistor (OFET) or an organic thin film transistor (OTFT).

13. The method according to claim 1, wherein $R^2$ is iso-propyl.

* * * * *